(12) United States Patent
Arora et al.

(10) Patent No.: US 7,088,121 B1
(45) Date of Patent: Aug. 8, 2006

(54) NON-CONTACT METHOD AND APPARATUS FOR ON-LINE INTERCONNECT CHARACTERIZATION IN VLSI CIRCUITS

(75) Inventors: Narain D. Arora, San Jose, CA (US); Rimma A. Pirogova, San Jose, CA (US)

(73) Assignee: Siprosys, Inc., San Jose, CA (US)

( * ) Notice: Subject to any disclaimer, the term of this patent is extended or adjusted under 35 U.S.C. 154(b) by 107 days.

(21) Appl. No.: 10/715,263

(22) Filed: Nov. 17, 2003

(51) Int. Cl.
G01R 31/26 (2006.01)

(52) U.S. Cl. ............... 324/765; 324/719; 324/158.1

(58) Field of Classification Search ............... None
See application file for complete search history.

(56) References Cited

U.S. PATENT DOCUMENTS

| | | | |
|---|---|---|---|
| 5,610,833 A | 3/1997 | Chang et al. | |
| 5,804,709 A * | 9/1998 | Bourgoin et al. | ............. 73/105 |
| 5,959,459 A | 9/1999 | Satya et al. | |
| 5,963,043 A | 10/1999 | Nassif | |
| 6,038,384 A | 3/2000 | Ehrler | |
| 6,086,238 A | 7/2000 | Mehrotra et al. | |
| 6,172,506 B1 * | 1/2001 | Adderton et al. | ........... 324/458 |
| 6,293,698 B1 | 9/2001 | Alvis | |
| 6,708,132 B1 * | 3/2004 | Gutierrez et al. | ........... 702/117 |

* cited by examiner

Primary Examiner—Vinh Nguyen
Assistant Examiner—Jimmy Nguyen
(74) Attorney, Agent, or Firm—Amin & Turocy, LLP

(57) ABSTRACT

A system that facilitates non-invasive in-line characterization of parameters of VLSI circuit interconnects is provided. A plurality of micro-electro-mechanical system (MEMS) cantilevers apply voltage(s) to VLSI circuit interconnect(s) without physical contact thereto. A measuring component measures deflection characteristics of the cantilevers, the deflection(s) correspond to electrical forces generated from the applied voltage(s) as passed through VLSI circuit interconnect(s). A component computes characteristics of the VLSI interconnect based at least in part upon the measured deflection characteristics.

45 Claims, 19 Drawing Sheets

NON-CONTACT METHOD AND APPARATUS FOR ON-LINE INTERCONNECT CHARACTERIZATION IN VLSI CIRCUITS

TECHNICAL FIELD

The present invention generally relates to characterization of capacitance and resistance relating to interconnects within VLSI circuits. More particularly, the present invention relates to non-contact in-line characterization of capacitance and resistance of VLSI circuit interconnects.

BACKGROUND OF THE INVENTION

Manufacturing and production of integrated circuits is a multi-billion dollar industry. A substantial amount of resources are utilized in connection with improving performance of integrated circuits, increasing yield, and increasing density of integrated circuits. For example, aggressive scaling (miniaturization) of devices has resulted in interconnect lines that are denser and shorter in width than ever before. As signals are delivered through interconnect lines, parasitic capacitance between the interconnect lines can become problematic due to cross talk and wire delays that are associated with such capacitance and resistance. If parasitic capacitance and resistance are not properly characterized and understood, cross talk and wire delays can compromise integrity and performance of the circuit. Accordingly, it is imperative that characteristics of interconnect parasitic capacitances be understood, measured, modeled, and controlled. Moreover, it is important to characterize all interconnect parasitic capacitances and resistances within a VLSI circuit in order to determine whether or not such elements fall outside bounds of design specifications and to characterize VLSI technology.

While there have been monumental advances related to increasing density of VLSI circuits, systems and/or methods of characterizing interconnects within VLSI circuits have not experienced such advances. For example, while interconnect capacitance exists (and thus can theoretically be measured) during fabrication of VLSI circuits, conventional systems and/or methodologies only measure interconnect capacitance after fabrication of a VLSI circuit has been completed. Characterization is then performed via directly contacting probes with large pads (80–100 μm) connected to the interconnects. The pads have to be large enough to enable positioning of a probe with an optical microscope. Moreover, conventional systems and/or methodologies require expensive, complicated, and sizeable testing structures to obtain measurements relating to capacitance of interconnects within VLSI circuits. Such conventional systems and/or methodologies are further associated with various other shortcomings, such as an inability to obtain in-line capacitance measurements due to a requirement for large pad area. Furthermore, contacting interconnects with probes can damage interconnect surfaces, thus compromising operability of VLSI circuits.

Scanning probe microscopy was developed to alleviate some of the aforementioned deficiencies by reducing size of a probe required to contact interconnect surfaces for both imaging and measuring parameters of the interconnects being tested. A direct contact measurement of small capacitances related to interconnects, however, is problematic as capacitance of cantilevers attached to probes are similar in magnitude or larger than parasitic interconnect capacitances desirably measured. Furthermore, oxide resident upon interconnect surfaces and tips of cantilevers can reduce accuracy of capacitance measurements.

In view of at least the above, there exists a strong need in the art for a system and/or methodology facilitating improved characterization of VLSI interconnect capacitance.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

As utilized in the following description, the term "characterization" refers to measurement of capacitance related to VLSI circuit interconnects, measurement of resistance related to VLSI circuit interconnects, and/or measurement of physical parameters related to VLSI circuit interconnects. The present invention facilitates in-line characterization of VLSI circuit interconnects, which alleviates several of the deficiencies of conventional systems and/or methods for characterizing VLSI circuit interconnects. For example, corrective action regarding a particular VLSI circuit can be taken prior to the circuit being deemed irreparable, thus increasing yield. Furthermore, the present invention can characterize VLSI circuit interconnects without requiring contact thereto, thus mitigating problems associated with contact measuring devices (e.g., damage to interconnect lines, compromised measurements due to capacitance of a probe, . . . ). Moreover, the system and/or methodology of the present invention requires substantially less space than that required by conventional systems and/or methodologies (e.g., a need for large test structures is mitigated).

The present invention employs two or more micro-electro-mechanical systems (MEMS) cantilevers with disparate resonant frequencies that can be employed to relay particular voltages to VLSI circuit interconnects without requiring contact with such VLSI circuit interconnects. For example, positioning components can position the MEMS cantilevers proximate to the VLSI circuit interconnects. Moreover, the MEMS cantilevers can include a conductive tip that enables voltages to be relayed from a voltage source to the VLSI circuit interconnects via the conductive tip. In accordance with one aspect of the present invention, the MEMS cantilever body can be employed as a conductive path from a voltage source to the conductive tip. Alternatively, a conductive path can be provided on the MEMS cantilever to facilitate an injection of currents into VLSI circuit interconnects.

Voltage drops that exist between the conductive tips and the VLSI circuit interconnects can produce electrostatic forces that cause the MEMS cantilevers to mechanically oscillate. A measuring system can be employed to sense and/or measure the mechanical oscillations for given voltages (e.g., disparate voltages applied between the VLSI circuit interconnects and the cantilever tips will generate differing mechanical oscillations). The measuring system can be any suitable measuring system. For example, a deflection detector can include a bridge and a piezoresistor located on a cantilever. A computing component can thereafter determine various parameters of the VLSI circuit interconnects based at least in part upon the mechanical oscillations. For example, parasitic capacitance, coupling capacitance between interconnects, capacitance between an interconnect and a ground plane within a substrate, physical parameters of the interconnect, etc. can all be computed and/or analyzed in accordance with one aspect of the present invention.

In accordance with another aspect of the present invention, a series of disparate voltages can be delivered to different MEMS cantilevers to obtain a robust characterization of VLSI circuit interconnects. For example, a single voltage source can comprise a plurality of different outputs, wherein each output can output voltages with differing voltages and frequencies. One or more switches can then be employed to effectuate selectively providing a conductive tip of the MEMS cantilever with an appropriate voltage. Alternatively, a plurality of disparate voltage sources can be employed to deliver differing voltages to separate conductive tips. In accordance with one particular aspect of the present invention, disparate voltages can be applied which cause only one MEMS cantilever to oscillate at its natural mechanical resonance, or, alternatively, at a selected frequency that provides optimal accuracy and resolution. A series of such voltages can be applied, and computations can be completed on mechanical oscillations resulting from such voltages, thereby effectuating a robust characterization of the VLSI circuit interconnects.

To the accomplishment of the foregoing and related ends, the invention then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed and the present invention is intended to include all such aspects and their equivalents. Other objects, advantages and novel features of the invention will become apparent from the following detailed description of the invention when considered in conjunction with the drawings.

DETAILED DESCRIPTION OF THE INVENTION

Figure 1:
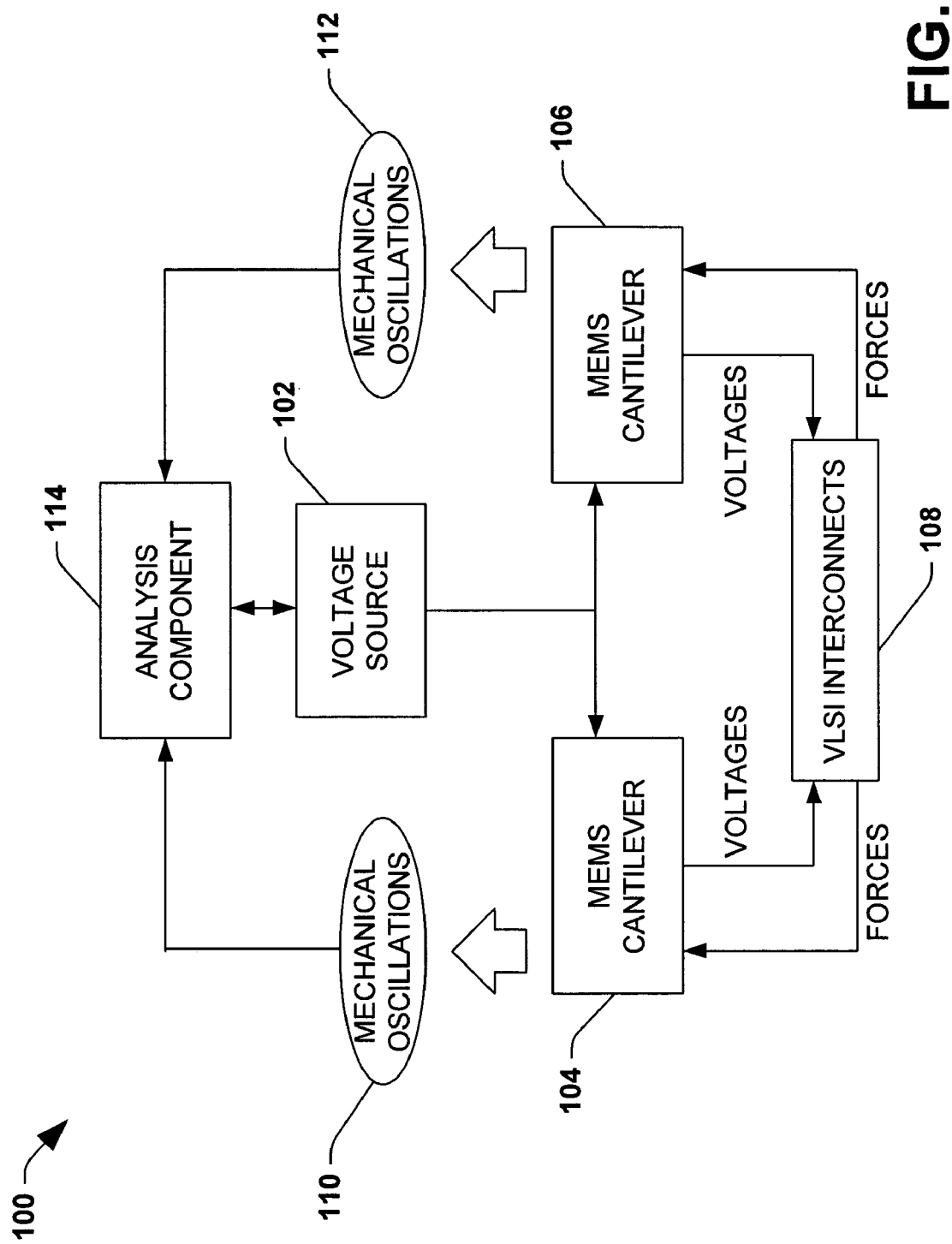
FIG. 1 is a block diagram of a system that facilitates characterization of VLSI circuit interconnects in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

Turning now to FIG. 1, a system 100 that facilitates in-line characterization of physical parameters related to VLSI circuit interconnects, including parasitic capacitance, coupling capacitance between VLSI circuit interconnects, etc. is illustrated. As used in this application, the term "interconnects" is intended to refer to interconnect lines, which can be metal or poly-silicon that is part of active devices (e.g., a transistor) or passive devices, contacts, vias, ground signal paths, or a combination thereof. Those skilled in the art can apply the illustrated system 100 to measurements some other VLSI test structures for characterization/monitoring purposes. The system 100 provides for improved characterization of physical parameters relating to VLSI circuit interconnects while not requiring a probe tip to physically contact VLSI circuit interconnects to obtain quality measurements. The system 100 of the present invention provides for substantial benefits over conventional systems, including an ability to characterize VLSI circuit interconnects prior to completion of fabrication, thus enabling in-line correction and/or control of fabrication of VLSI circuits. Furthermore, operability of VLSI circuit interconnects is not compromised due to physical damage caused by probes contacting VLSI circuit interconnects. The system 100 comprises a voltage source 102 that relays AC voltages to at least two MEMS cantilevers 104 and 106, respectively. The cantilevers 104 and 106 each comprise conductive tips (not shown), and are further designed to have disparate natural resonant frequencies. In accordance with one aspect of the present invention, the natural resonant frequencies can be less than 200 kHz. Furthermore, the natural resonance of the MEMS cantilevers 104 and 106 can have a ratio of approximately between 1.1 and 1.3. The MEMS cantilevers 104 and 106 are positioned relative to VLSI circuit interconnects 108, wherein a conductive tip of the MEMS cantilever 104 is positioned proximate to the VLSI circuit interconnects 108 on a side of the VLSI circuit interconnects 108 and a conductive tip of the MEMS cantilever 106 is positioned proximate to the VLSI circuit interconnects 108 on a substantially opposite side of the VLSI circuit interconnects 108. AC voltages received by the MEMS cantilevers 104 and 106 are delivered to the conductive tips of the MEMS cantilevers 104 and 106, which then inject AC current(s) into the VLSI circuit interconnects 108. Physical parameters (e.g., capacitance) of the VLSI circuit interconnects 108 alter the voltages that are initially delivered across the VLSI circuit interconnects 108, which are thereafter received by the conductive tips of the MEMS cantilevers 104 and 106. The MEMS cantilevers thereafter mechanically oscillate due to electrical forces resulting from AC voltages injected into the VLSI circuit interconnects 108.

Mechanical oscillations 110 and 112 of each MEMS cantilever 104 and 106 are sensed and relayed to an analysis component 114, which facilitates characterization of the VLSI circuit interconnect(s) based at least in part upon the mechanical oscillations 110 and 112. For example, given particular voltages delivered to the MEMS cantilevers 104 and 106, resultant mechanical oscillations 110 and 112 can be employed by the analysis component 114 to obtain a measurement of coupling capacitance between VLSI circuit interconnects. Furthermore, the analysis component 114 can utilize mechanical oscillations 110 and 112 of the MEMS cantilevers 104 and 106 to determine capacitance between one or more VLSI circuit interconnects 108 and a substrate (acting as ground) in which the VLSI circuit interconnects 108 reside. Moreover, parasitic capacitances can be computed by the analysis component 114 based at least in part on the mechanical oscillations 110 and 112 resulting from particular sinusoidal voltages delivered by the voltage source 102 to the MEMS cantilevers 104 and 106. The voltage source 102 can be employed to output disparate AC voltages (magnitude and frequency) to the MEMS cantilevers 104 and 106. Injecting the VLSI circuit interconnects 108 with a plurality of AC currents effectuates robust calculations of parameters relating to the VLSI circuit interconnects 108. For instance, a series of disparate AC currents can be injected into the VLSI circuit interconnects 108 to facilitate characterization of the VLSI circuit interconnects 108. Furthermore, maintaining a particular AC voltage delivered to the MEMS cantilever 104 while altering AC voltages delivered to the MEMS cantilever 106 can provide for characterization of VLSI circuit interconnects.

In accordance with another aspect of the present invention, the MEMS cantilever 104 can be designed in a manner to enable a conductive tip (not shown) associated with the MEMS cantilever 104 to contact the VLSI circuit interconnects 108 while the conductive tip (not shown) associated with the MEMS cantilever 106 does not contact the VLSI circuit interconnects 108. The contacting MEMS cantilever 104 can be positioned in such a manner to substantially mitigate damage and/or contamination that is associated with conventional contact-characterization systems and/or methodologies. In such a modality, fewer disparate AC voltages can be injected into the VLSI circuit interconnects 108 while maintaining a robust characterization of such interconnects 108. Furthermore, the analysis component 114 can retain the mechanical oscillations 110 and 112 resulting from a plurality of disparate AC voltages induced on the VLSI circuit interconnects 108 in order to further calculate and/or analyze parameters of the VLSI circuit interconnects 108. For example, the analysis component 114 can be employed to trend data and analyze such trended data relating to the VLSI circuit interconnects 108. Furthermore, the analysis component 114 can effectuate automatic control and/or correction of VLSI circuit manufacturing process steps based at least in part upon the mechanical oscillations 110 and 112 (e.g., trended data can indicate particular manufacturing steps that need and/or do not need correction).

In accordance with another aspect of the present invention, the MEMS cantilevers 104 and 106 can be piezo-resistive cantilevers, which enable the cantilevers 104 and 106 to be self-sensing (e.g., can sense mechanical oscillations occurring on the cantilevers) and/or self-actuating. For instance, an alteration in resistance of the cantilevers 104 and 106 is indicative of deflection at a free end of the cantilevers 104 and 106. Moreover, a sensitivity to force can be computed as a fractional change in resistance for a given force applied at a free end of the cantilevers 104 and 106. Piezo-resistive cantilevers further can be employed in both contact and non-contact modalities.

In accordance with one aspect of the present invention, mechanical oscillations of the MEMS cantilevers 104 and 106 can be sensed by a laser-detection system. For example, a laser light can be directed from a laser and delivered by an integrated light guide to a MEMS cantilever, and a photo detector can be employed to capture laser light deflection from/by the cantilevers. Alternatively, an optical interferometer can be employed in connection with sensing mechanical oscillations existent in the MEMS cantilevers 104 and 106. Furthermore, it is to be understood that the MEMS cantilevers 104 and 106 comprise a conductive tip in order to enable AC currents to be injected into the VLSI circuit interconnects. In accordance with one aspect of the present invention, a conductive path can be provided across the MEMS cantilevers 104 and 106 to the conductive tips. Alternatively, the MEMS cantilevers 104 and 106 can be of a conductive material, and the body of such MEMS cantilevers 104 and 106 can be employed as a portion of a conductive path to the conductive tips.

The system 100 enables measurement of particularly small capacitances existent in interconnects 108. For example, the system 100 enables measurement of capacitances as small as 1 fF. Moreover, particularly small interconnects can be characterized utilizing the system 100. For instance, the interconnect lines 108 can be less than 10 µm, and space between two interconnects can be less than 0.2 µm. Moreover, portion(s) of the interconnects 108 can be on disparate layers of a VLSI circuit, and can further be covered by a dielectric layer.

Figure 2:
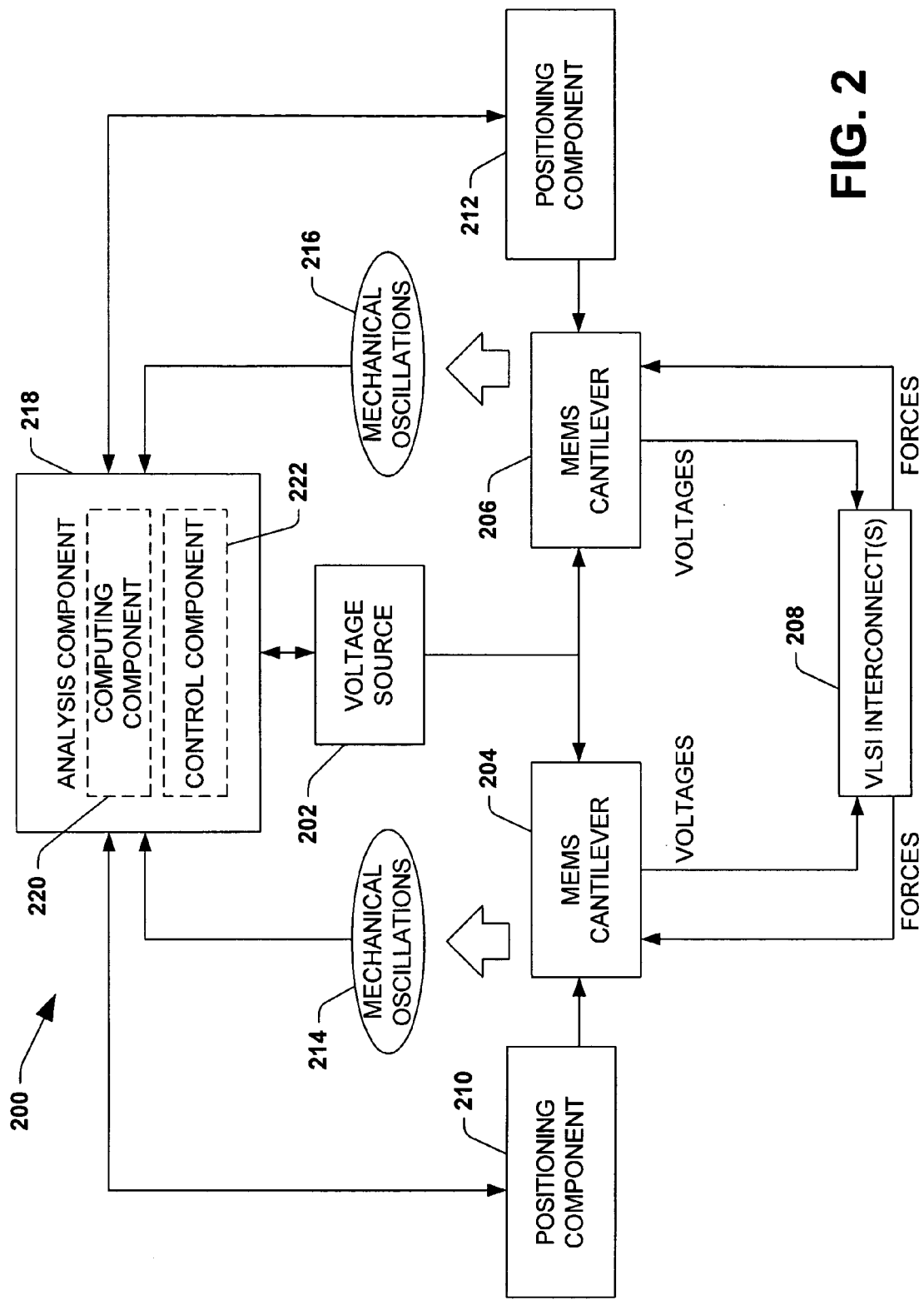
FIG. 2 is a block diagram of a system that facilitates positioning and characterization of VLSI circuit interconnects in accordance with an aspect of the present invention.

Referring now to FIG. 2, a system 200 that facilitates in-line characterization of VLSI circuit interconnects is illustrated. The system 200 includes a voltage source 202 that provides a plurality of AC voltages to MEMS cantilevers 204 and 206, wherein the MEMS cantilevers have disparate natural resonance frequencies. The MEMS cantilevers 204 and 206 are positioned proximate to VLSI circuit interconnects 208, thereby enabling conductive tips (not shown) associated with the MEMS cantilevers 204 and 206 to inject the VLSI circuit interconnects 208 with AC currents provided by the voltage source 202. The MEMS cantilevers 204 and 206 positioned proximate to the VLSI circuit interconnects 208 by positioning components (e.g., scanners) 210 and 212, respectively. Injection of AC currents into the VLSI circuit interconnects 208 results in electrical forces applied to the MEMS cantilevers 204 and 206, thus causing such MEMS cantilevers 204 and 206 to oscillate. Mechanical oscillations 214 and 216 are sensed and relayed to an analysis component 218, which effectuates robust characterization of the VLSI circuit interconnects 208 based at least in part upon the mechanical oscillations 214 and 216.

The analysis component 218 includes a computing component 220 that effectuates calculating measurements relating to the VLSI circuit interconnects 208 based at least in part upon voltages applied to the MEMS cantilevers 204 and 206 as well as mechanical oscillations 214 and 216 resulting from such voltages. Furthermore, position of the MEMS cantilevers 204 and 206 with respect to the VLSI circuit interconnects 208 can also be employed by the computing component 220 in connection with calculating various parameters relating to the VLSI circuit interconnects 208. Calculations that can be made by the computing component 220 will be described in greater detail herein.

The analysis component 218 is further associated with a control component 222 that can utilize the mechanical oscillations 214 and 216, the voltages applied to the MEMS cantilevers 204 and 206, as well as calculation made by the computing component 220 to control the positioning components 210 and 212 as well as fabrication process steps. For instance, the control component can effectuate alteration of position of the MEMS cantilevers 204 and 206 with respect to the VLSI circuit interconnects 208 via relaying control commands/signals to the positioning components 210 and 212. Furthermore, the control component 222 can effectuate feed-forward and/or feedback control of various process steps. For example, calculations by the computing component 220 can be analyzed by the control component 222 to determine if any deviation and/or faults related to the VLSI circuit interconnects exist (e.g., whether parameters are sufficiently within design specifications). Based at least in part upon such calculations, the control component 222 can determine which fabrication process step requires adjustment to effectuate optimal fabrication of a VLSI circuit. Moreover, as the VLSI circuit interconnects 208 can be characterized in-line, the control component 222 can adjust later fabrication process steps to ensure that VLSI circuit fabrication is optimized. In accordance with one aspect of the present invention, the positioning components 210 and 212, the MEMS cantilevers 204 and 206, and the VLSI circuit interconnects 208 can be positioned within a vacuum chamber.

Figure 3:
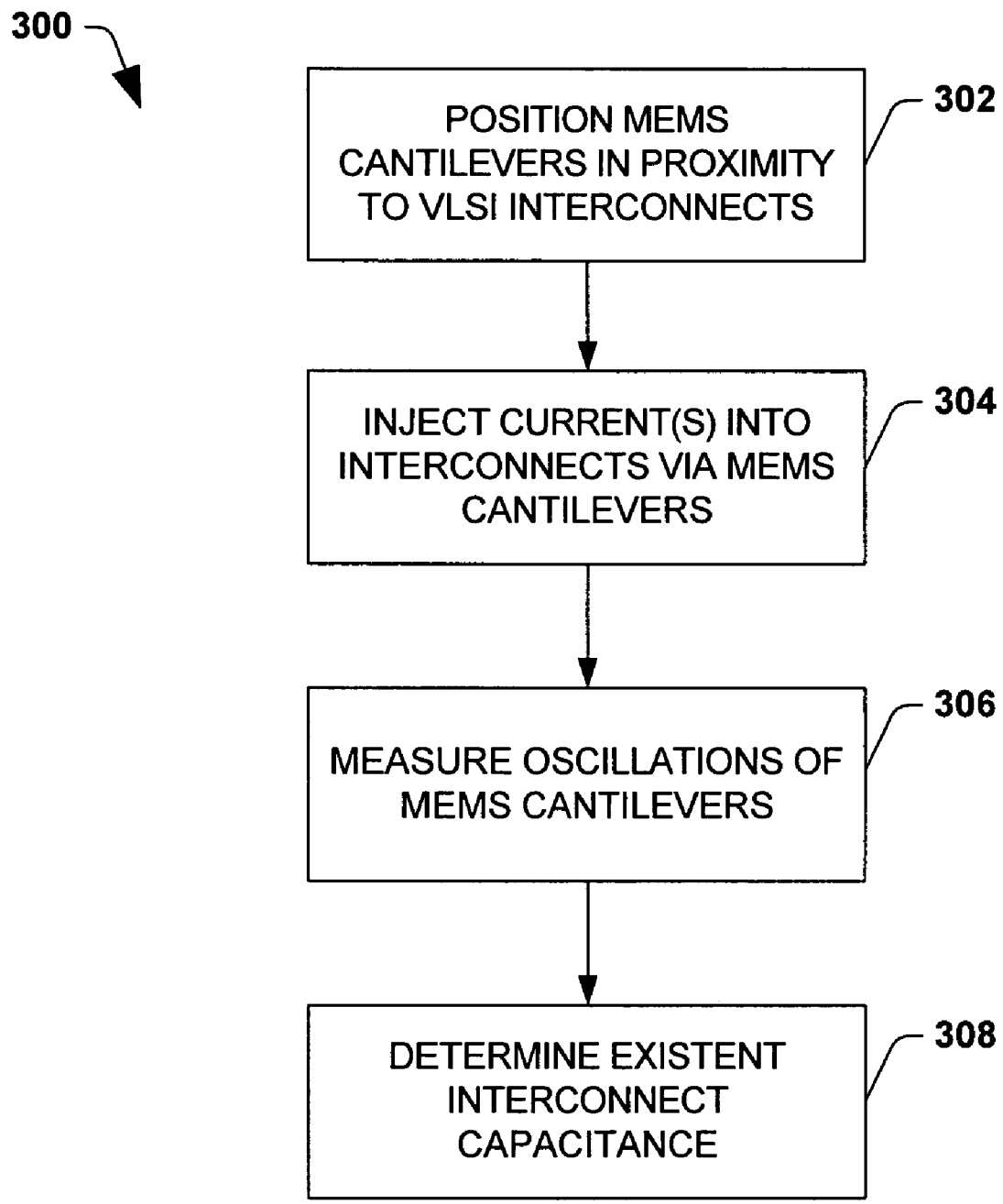
FIG. 3 is a representative flow diagram that illustrates a methodology that facilitates characterization of VLSI circuit interconnects in accordance with one aspect of the present invention.

Turning now to FIG. 3, a methodology 300 for characterizing VLSI circuit interconnects during fabrication without requiring probes to contact such interconnects is illustrated. While, for purposes of simplicity of explanation, the methodology 300 is shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

At 302, MEMS cantilevers are positioned in proximity to VLSI circuit interconnects that are desirably tested. The cantilevers are positioned in a manner to allow AC currents to enter the interconnects without requiring physical contact thereto. In accordance with one aspect of the present invention, the cantilevers can be piezo-resistive cantilevers. Alternatively, the cantilevers can be positioned upon a tuning fork. Moreover, one cantilever can be provided with a contact probe that enables contact to a first VLSI circuit interconnect and does not oscillate, while a second cantilever does not contact any VLSI interconnect and can oscillate. Providing one of the cantilevers in contact with one interconnect can facilitate a more expedient characterization of the interconnects.

At 304, AC currents are injected into the interconnects via tips of the MEMS cantilevers. In accordance with one aspect of the present invention, a series of disparate AC currents can be selectively injected into the VLSI circuit interconnects to facilitate a robust characterization of the interconnects. Moreover, a voltage source can comprise a plurality of outputs for outputting disparate voltages, and switches can be employed to provide each cantilever with disparate AC voltages (amplitude and/or frequency). The voltage drops between the cantilever tip and the interconnect result in electrical forces that cause the MEMS cantilevers to oscillate.

At 306, existent oscillations on the MEMS cantilevers caused by the injection of AC currents into the interconnects are measured. In accordance with one aspect of the present invention, the MEMS cantilevers can be self-sensing, thereby facilitating sensing and/or measurement of mechanical oscillation existent on the cantilevers. Furthermore, pre-amplifiers and amplifiers can be provided to amplify electrical signals produced by the mechanical oscillations to facilitate measurement and analysis of such oscillations. In accordance with one aspect of the present invention, mechanical oscillations relating to a series of disparate voltages applied to the cantilever tips can be measured and employed in connection with characterizing VLSI circuit interconnects.

At 308, the mechanical oscillations are employed to characterize the VLSI circuit interconnects. For example, physical parameters of the VLSI circuit interconnects can be measured and analyzed based at least in part upon the sensed mechanical oscillations given particular voltages applied to the cantilever tips. Moreover, coupling capacitance between VLSI circuit interconnects can be determined, as well as capacitance between a VLSI circuit interconnect and a substrate (acting as ground). In accordance with another aspect of the present invention, parasitic capacitance and/or resistance related to the VLSI circuit interconnects can be monitored and analyzed. Such a methodology 300 provides significant improvement over conventional systems in that the VLSI circuit interconnects can be characterized in-line. Further, ohmic contact between a probe and the interconnects is not required when the methodology 300 is employed.

Figure 4:
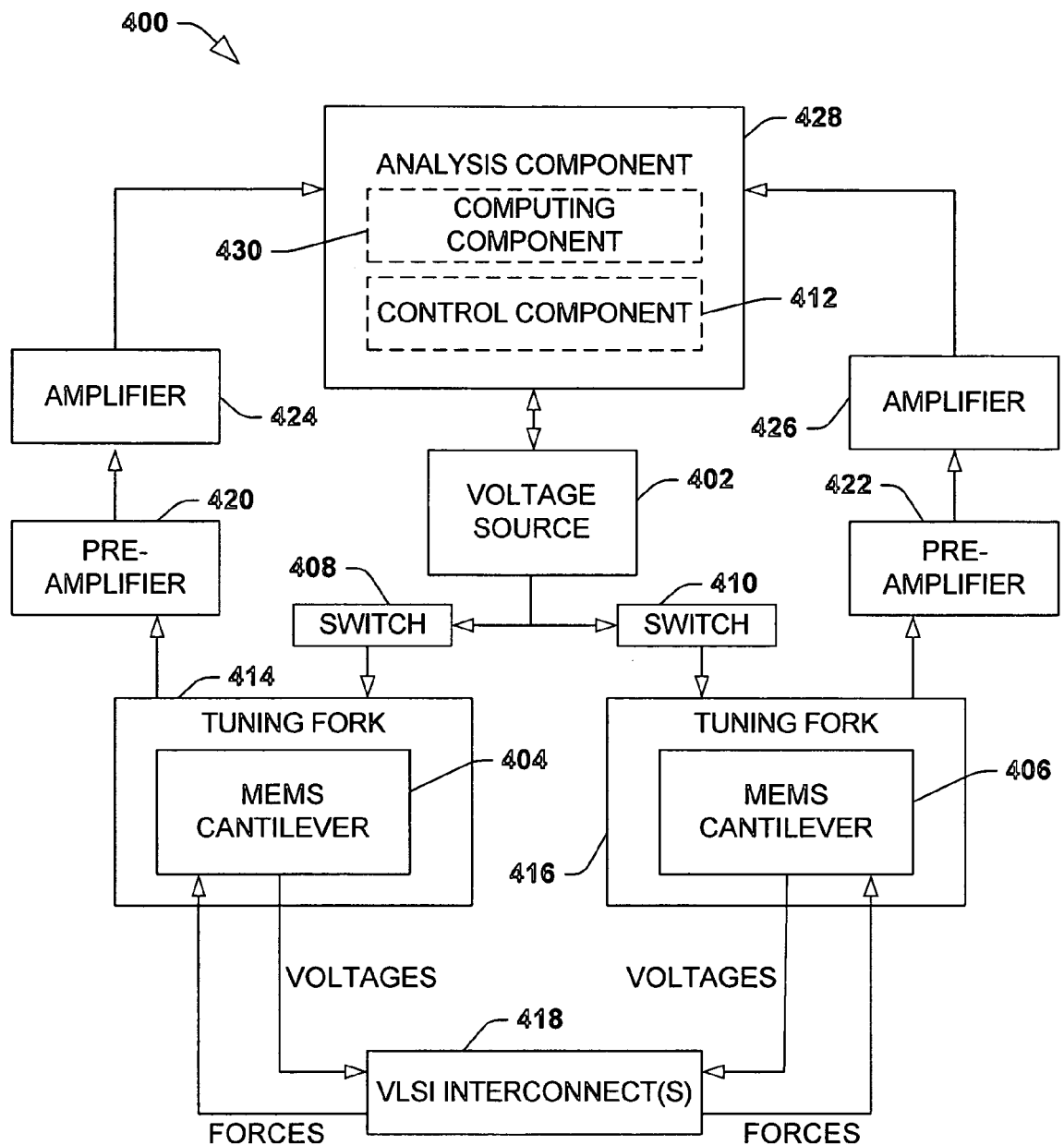
FIG. 4 is a block diagram of a system that facilitates characterization of VLSI circuit interconnects in accordance with an aspect of the present invention.

Now regarding FIG. 4, a system 400 that facilitates in-line characterization of VLSI circuit interconnects without requiring a probe to contact such interconnects is illustrated. The system 400 includes a voltage source 402 that is employed to deliver AC voltages to MEMS cantilevers 404 and 406, wherein the cantilevers 404 and 406 are associated with disparate natural resonance frequencies. The AC voltages can be delivered to the MEMS cantilevers 404 and 406 via switches 408 and 410, which enable disparate AC voltages to be delivered to the MEMS cantilevers 404 and 406 by the single voltage source 402. Providing a plurality of disparate AC voltages to the MEMS cantilevers 404 and 406 enables robust characterization of VLSI circuit interconnects. The switches 408 and 410 can be controlled by a control component 412. For instance, the voltage source 402 can comprise a plurality of outputs, and the control component 412 can effectuate positioning of the switches 408 and 410 in a manner wherein desirable outputs of the voltage source 402 are relayed to the MEMS cantilevers 404 and 406.

The MEMS cantilevers 404 and 406 can be positioned on tuning forks 414 and 416, respectively. The tuning forks 414 and 416 can be self-sensing (e.g., they can sense mechanical oscillations occurring on the tuning forks 414 and 416) and/or self-actuating. For example, the tuning forks 414 and 416 can be quartz tuning forks. In accordance with one aspect of the present invention, the MEMS cantilevers 404 and 406 are generated with a pair of legs, wherein each leg is attached to one prong of the tuning fork. Moreover, bodies of the cantilevers 404 and 406 can serve as a portion of the conductive path from the voltage source 402 to the tips (not shown) of the MEMS cantilevers 404 and 406. However, the conductive path must be shielded from the tuning fork bodies, which can be effectuated, for example, by providing grounded electrodes to serve as electrostatic shields. More particularly, three layers of metal can be employed, wherein a first layer is tuning fork body electrodes, a second layer is a shielded electrode, and a third layer is a conductive path to allow AC voltages to be delivered to the MEMS cantilevers 404 and 406.

Desirable AC voltages can thus be delivered from the voltage source 402 to the MEMS cantilevers 404 and 406 via the switches 408 and 410. The AC currents can then be injected into VLSI circuit interconnects 418, which results in generation of electrical forces that cause the tuning forks 414 and 416 to oscillate. Pre-amplifiers 420 and 422 and amplifiers 424 and 426 can be employed to amplify electrical signals produced by mechanical oscillations, which are indicative of particular parameters of the VLSI circuit interconnects 418. The amplified electrical signals can then be received by an analysis component 428 that facilitates characterization of the VLSI circuit interconnects 418. The analysis component can be associated with a computing component 430 that calculates one or more parameters of the VLSI circuit interconnects 418 based at least in part upon the amplified oscillations. Moreover, the control component 412 can control one or more fabrication process steps based at least in part upon measurements calculated by the computing component 428.

Figure 5:
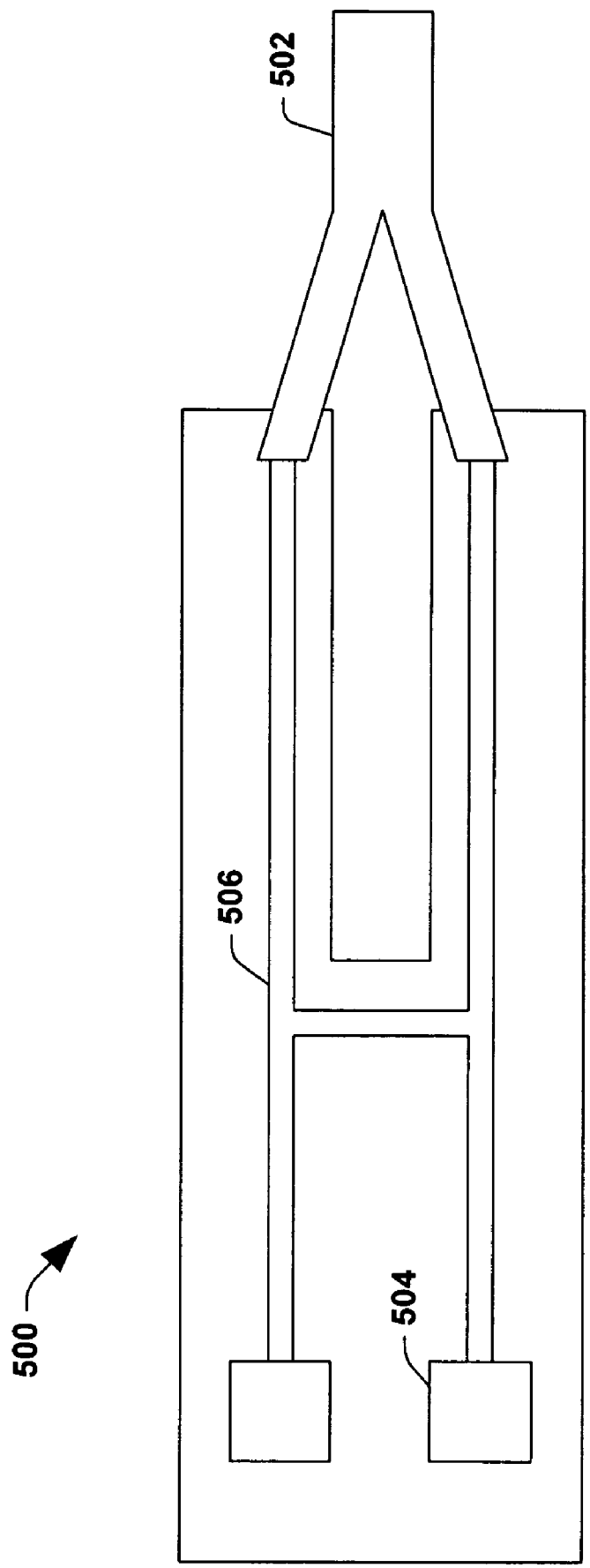
FIG. 5 is an exemplary arrangement of a MEMS cantilever and a tuning fork in accordance with an aspect of the present invention.

Now regarding FIG. 5, an exemplary tuning fork 500 that can be employed in connection with the present invention is illustrated. A MEMS cantilever 502 with a pair of legs can be positioned upon the tuning fork 500 to provide a first leg of the cantilever 502 on a first prong of the tuning fork 500 and a second leg of the cantilever 502 on a second leg of the tuning fork 500. The MEMS cantilever 502 can be coupled to a voltage source (not shown) via pads 504 and a conductive path 506. Furthermore, the MEMS cantilever 502 should also be conductive, thereby allowing voltages to travel through such cantilever 502 and into VLSI circuit interconnects (not shown). For instance, the MEMS cantilever 502 can be composed of a metal that is substantially similar to a metal utilized in the conductive path 506. The tuning fork 500 can be self-sensing and/or self-actuating, thereby mitigating a requirement for expensive sensing equipment. More particularly, the tuning fork 500 can be a quartz tuning fork in accordance with one particular aspect of the present invention.

Figure 6:
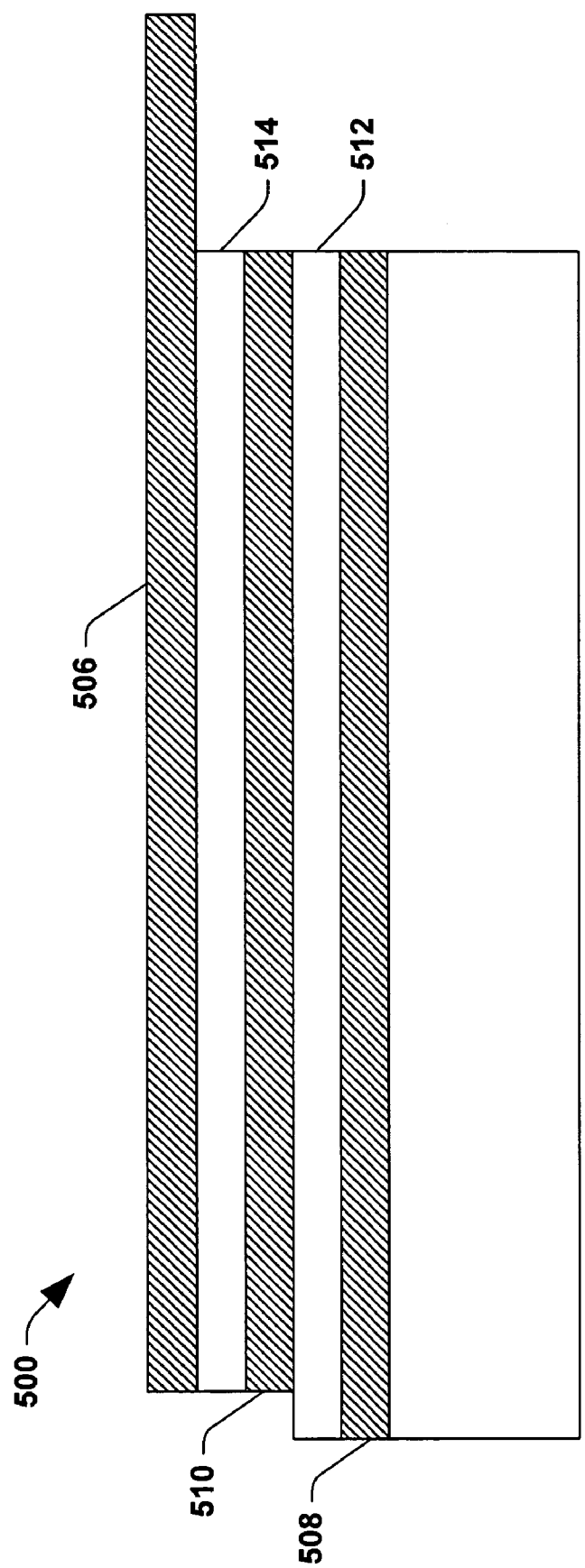
FIG. 6 is a cross-sectional presentation of an exemplary layering of metals and dielectrics to provide for shielding a conductive path in accordance with an aspect of the present invention.

Turning briefly to FIG. 6, a cross section of the tuning fork 500 is illustrated. The conductive path 506 should be shielded from a body of the tuning fork 500 via grounded electrodes that can serve as an electrostatic shield. For example, the tuning fork 500 can include three disparate layers of metal, wherein a first layer 508 is employed as tuning fork electrodes, a second layer 510 is employed as a shielded electrode, and a third layer is the conductive path 506. The layers of metal are separated by dielectric layers 512 and 514 (e.g., a layer between the tuning fork electrodes 508 and the shielding electrodes 510, and a layer between the shielding electrodes 510 and the conductive path 506). Moreover, while not illustrated with respect to FIGS. 5 and 6, it is to be understood that the output pads 504 (FIG. 5) should be located proximate to the tuning fork electrode output pads (not shown) in order to effectuate generation of an electrostatic shield. Furthermore, it is to be understood that the cantilever 502 (FIG. 5) can be fastened to the tuning fork 500 via any acceptable means (e.g., glue).

Figure 7:
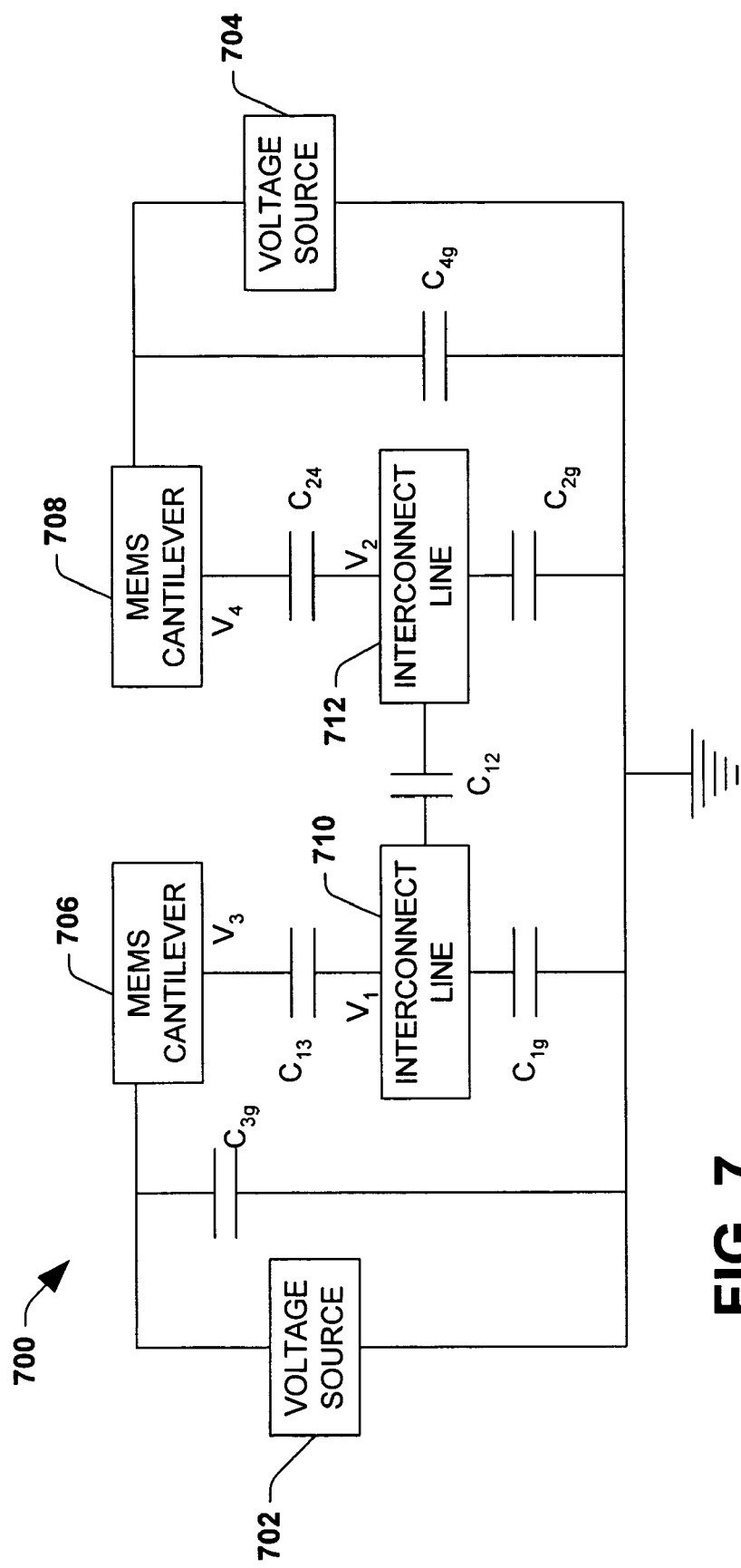
FIG. 7 is an exemplary schematic in accordance with an aspect of the present invention.
Figure 8:
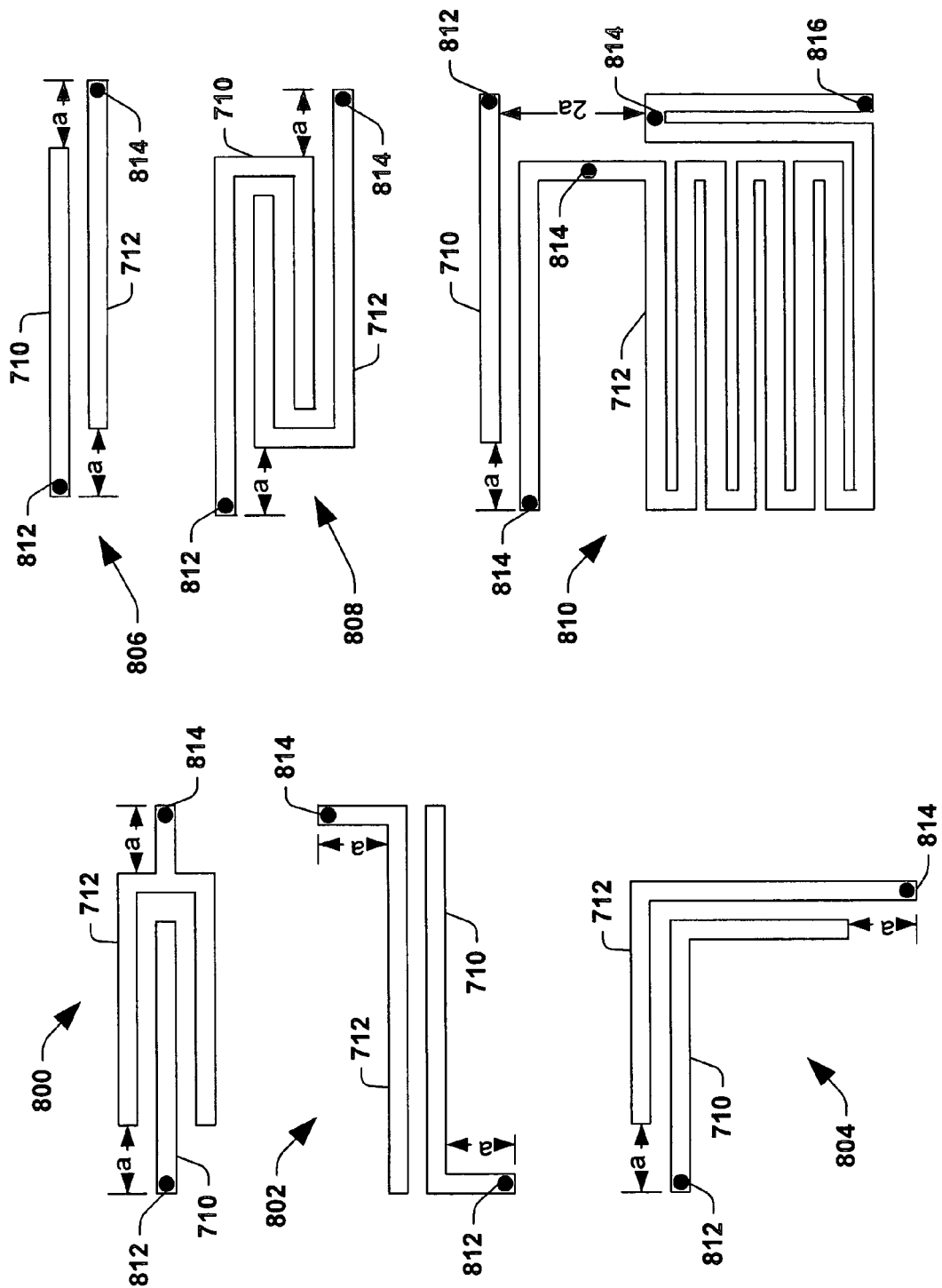
FIG. 8 illustrates a plurality of disparate test structures that can be employed in connection with the present invention.

Now turning to FIG. 7, an exemplary schematic 700 of a system that can be employed in connection with the present invention is illustrated. The schematic 700 includes a pair of voltage sources 702 and 704 that are utilized to deliver AC voltages to a pair of MEMS cantilevers 706 and 708. While the exemplary schematic 700 displays two voltage sources 702 and 704, it is to be understood that a single voltage source coupled to two or more switches can be employed to create a substantially similar schematic. AC voltages delivered by the voltage sources 702 and 704 create AC currents that are injected into a pair of VLSI circuit interconnects 710 and 712 via the MEMS cantilevers 706 and 708. The AC currents induce AC voltages on the pair of VLSI circuit interconnects 710 and 712. In such an embodiment, the interconnects 710 and 712 can be characterized in-line, and contact to such interconnects 710 and 712 with probes is not required. Moreover, coupling capacitances between the MEMS cantilevers 706 and 708 and the interconnects 710 and 712 as well as coupling capacitances between the interconnects 710 and 712 and adjacent interconnects can be neglected. Turning briefly to FIG. 8, a plurality of test structures 800–810 are illustrated. The interconnects 710 and 712 (FIG. 7) can be positioned and/or shaped in a manner to enable testing of the subject invention (e.g., the interconnects 710 and 712 can be utilized as test structures 800–810). Moreover, results obtained via the test structures can be employed as empirical data and utilized in connection with characterizing interconnects that are not positioned and/or shaped in a similar manner to the test structures 800–810. Exemplary locations of conductive tips 812 and 814 of the MEMS cantilevers 706 and 708 (FIG. 7), respectively, are further illustrated on the interconnects 710 and 712. Moreover, a line 816 is displayed with respect to test structure 810 that connects the test structure 810 to a ground of the substrate. The distance $\alpha$ between disparate ends of the test structures can be approximately 1 μm. The test structure 810 illustrates a plurality of disparate locations that the conductive tip 814 can be located on the interconnect 712 in connection with characterizing the VLSI interconnects 710 and 712.

A described theory below is intended to illustrate exemplary modalities of operation from a simulation/optimization viewpoint for test structures similar to those shown in FIG. 8. These exemplary test structures are part of the subject invention, as they have been developed to minimize all parasitic capacitances between the cantilevers 706, 708 and the interconnects 710 and 712. Furthermore, although one particular set of test structures have been illustrated, many other test structures or fragments of a real product interconnects can be utilized for process performance characterization.

During instances that AC signals of less than approximately 300 kHz are employed, and transmission line effects can be neglected, the capacitance matrix of the cantilevers-interconnects system where interconnects can be the lines of the test structures shown in FIG. 8 can be written as:

$$[C] = \begin{bmatrix} C_{11} & -C_{12} & -C_{13} & 0 \\ -C_{12} & C_{22} & 0 & -C_{24} \\ -C_{13} & 0 & C_{33} & 0 \\ 0 & -C_{24} & 0 & C_{44} \end{bmatrix}$$

where $C_{11}=C_{1g}+C_{12}+C_{13}$, $C_{22}=C_{2g}+C_{12}+C_{24}$, $C_{33}=C_{3g}+C_{13}$, and $C_{44}=C_{4g}+C_{24}$. AC voltages $V_3$ and $V_4$ are applied to tips (not shown) of the MEMS cantilevers 706 and 708, thereby causing an AC current to flow through the VLSI circuit interconnects 710 and 712 to ground. Potentials $U_1$ and $U_2$ are induced by such current flow, such that $V_1$ and $V_2$ can be written as $V_1=U_1+\Delta\Phi$ and $V_2=U_2+\Delta\Phi$, where $\Delta\Phi$ is a time independent component of a potential of the VLSI circuit interconnects 710 and 712 that depend upon material of the interconnects 710 and 712.

The potentials $U_1$ and $U_2$ for interconnects comprising the above capacitance matrix can be written as $U_1=\Psi_1^{(3)}V_3+\Psi_1^{(4)}V_4$, and $\Psi_2^{(3)}V_3=\Psi_2^{(4)}V_4$, respectively, where $\Psi_1^{(3)}$, $\Psi_1^{(4)}$, $\Psi_2^{(3)}$ and $\Psi_2^{(4)}$ are functions of capacitances $C_{11}$, $C_{22}$, $C_{12}$, $C_{13}$ and $C_{24}$, and for the small amplitudes of the mechanical oscillations one can write:

$$\Psi_1^{(3)} = \frac{C_{22}C_{13}}{D}, \Psi_2^{(3)} = \frac{C_{12}C_{13}}{D}, \Psi_1^{(4)} = \frac{C_{12}C_{24}}{D}, \Psi_2^{(4)} = \frac{C_{11}C_{24}}{D},$$

where $D=C_{11}C_{22}-C_{12}^2$. The AC potentials $V_3$ and $V_4$ are harmonic, and can be defined by equations $V_3=V_{30}\sin(\Omega_3 t)$ and $V_4=V_{40}\sin(\Omega_4 t)$, where $\Omega_3$ and $\Omega_4$ are angular frequencies. $V_{10}$, $V_{20}$, $V_{30}$, $V_{40}$, $V_{50}$, $V_{60}$, and $V_{70}$ are amplitudes of voltages that can be output from a voltage source. Such amplitudes can be pre-defined or empirically determined. Via substitution, equations for induced potentials $U_1$ and $U_2$ can be written as $U_1=V_{30}\Psi_1^{(3)}\sin(\Omega_3 t)+V_{40}\Psi_1^{(4)}\sin(\Omega_4 t)$ and $U_2=V_{30}\Psi_2^{(3)}\sin(\Omega_3 t)+V_{40}\Psi_2^{(4)}\sin(\Omega_4 t)$.

Existent voltage drops between the MEMS cantilevers 706 and 708 and the VLSI circuit interconnects 710 and 712 produces electrostatic forces $F_3$ and $F_4$, respectively, that can deflect the cantilevers 706 and 708. With respect to time, the electrostatic forces $F_3(t)$ and $F_4(t)$ can be defined as a summation of seven components: electrostatic forces $F_{3,\Delta\Phi}$ and $F_{4,\Delta\Phi}$ and six time-dependent harmonic electrostatic forces with frequencies $\Omega_3$, $\Omega_4$, $2\Omega_3$, $2\Omega_4$, $\Omega_3+\Omega_4$ and $\Omega_4-\Omega_3$. For example, $F_3(t)\pm F_{3,\Delta\Phi}+F+F_{3,\Delta\Phi\Omega_3}\sin\Omega_4 t+F_{3,2}\Omega_3\cos 2\Omega_3 t+F_{3,2}\Omega_4\cos 2\Omega_4 t+F_{3,\Omega_4\pm\Omega_3}[\cos(\Omega_3+\Omega_4)t+\cos(\psi_4-\Omega_3)t]$, and $F_4(t)\pm F_{4,\Delta\Phi}+F_{4,\Delta\Phi,\Omega_3}\sin\Omega_3 t+F_{4,\Delta\Phi,\Omega_4}\sin\Omega_4 t+F_{4,2\Omega_3}\cos 2\Omega_3 t+F_{4,2\Omega_4}\cos 2\Omega_4 t+F_{4,\Omega_4\pm\Omega_3}[\cos(\Omega_3+\Omega_4)t+\cos(\Omega_4+\Omega_3)t]$. Given the above schematic 700 and capacitance matrix, amplitudes of the electrostatic force components can be defined as follows:

$$F_{3,2\Omega_3} = V_{10}^2\left[\frac{\partial C_{3g}}{\partial d_1} + \left(1-2\Psi_1^{(3)}+\Psi_1^{(3)2}\right)\frac{\partial C_{13}}{\partial d_1} - 2(1-\Psi_1^{(3)})C_{13}\left(\frac{\partial \Psi_1^{(3)}}{\partial d_1}\right)\right];$$

$$F_{3,2\Omega_4} = V_{20}^2\left[(\Psi_1^{(4)})^2\frac{\partial C_{13}}{\partial d_1} + 2(\Psi_1^{(4)})C_{13}\frac{\partial \Psi_1^{(4)}}{\partial d_1}\right];$$

$$F_{3,\Omega_4\pm\Omega_3} = -2V_{30}V_{40}\left[(1-\Psi_1^{(3)})\Psi_1^{(4)}\frac{\partial C_{13}}{\partial d_1} + \left(\frac{\partial \Psi_1^{(4)}}{\partial d_1} - \Psi_1^{(3)}\frac{\partial \Psi_1^{(4)}}{\partial d_1} - \Psi_1^{(4)}\frac{\partial \Psi_1^{(3)}}{\partial d_1}\right)C_{13}\right];$$

$$F_{3,\Delta\Phi,\Omega_3} = \Delta\Phi \cdot V_{60}\left[(1-\Psi_1^{(3)})\frac{\partial C_{13}}{\partial d_1} - C_{13}\frac{\partial \Psi_1^{(3)}}{\partial d_1}\right];$$

$$F_{3,\Delta\Phi,\Omega_4} = -\Delta\Phi \cdot V_{60}\left[\Psi_1^{(4)}\frac{\partial C_{13}}{\partial d_1} + C_{13}\frac{\partial \Psi_1^{(4)}}{\partial d_1}\right];$$

$$F_{4,2\Omega_3} = V_{10}^2\left[\Psi_2^{(3)2}\frac{\partial C_{24}}{\partial d_2} + 2\Psi_2^{(3)}C_{24}\left(\frac{\partial \Psi_2^{(3)}}{\partial d_2}\right)\right];$$

$$F_{4,2\Omega_4} = V_{20}^2\left[\frac{\partial C_{4g}}{\partial d_2} + \left(1-2\Psi_2^{(4)}+\Psi_2^{(4)2}\right)\frac{\partial C_{24}}{\partial d_2} - 2(1-\Psi_2^{(4)})C_{24}\left(\frac{\partial \Psi_2^{(4)}}{\partial d_2}\right)\right];$$

$$F_{4,\Omega_4\pm\Omega_3} = -2V_{30}V_{50}\left[(1-\Psi_2^{(4)})\Psi_2^{(3)}\frac{\partial C_{24}}{\partial d_2} + \left(\frac{\partial \Psi_2^{(3)}}{\partial d_2} - \Psi_2^{(4)}\frac{\partial \Psi_2^{(3)}}{\partial d_2} - \Psi_2^{(3)}\frac{\partial \Psi_2^{(4)}}{\partial d_2}\right)C_{24}\right];$$

$$F_{4,\Delta\Phi,\Omega_3} = -\Delta\Phi \cdot V_{70}\left[\Psi_2^{(3)}\frac{\partial C_{24}}{\partial d_2} + C_{24}\frac{\partial \Psi_2^{(3)}}{\partial d_2}\right];$$

$$F_{4,\Delta\Phi,\Omega_4} = \Delta\Phi \cdot V_{70}\left[(1-\Psi_2^{(4)})\frac{\partial C_{24}}{\partial d_2} - C_{24}\frac{\partial \Psi_2^{(4)}}{\partial d_2}\right];$$

$$F_{3,\Delta\Phi} = \frac{1}{2}\Delta\Phi^2\frac{\partial C_{13}}{\partial d_1}; \text{ and } F_{4,\Delta\Phi} = \frac{1}{2}\Delta\Phi^2\frac{\partial C_{24}}{\partial d_2}, \text{ where}$$

$$\frac{\partial \Psi_1^{(3)}}{\partial d_1} = \frac{-C_{22}^2 C_{13}}{D^2}\left[\frac{\partial C_{13}}{\partial d_1}\left(1-\frac{D}{C_{13}C_{22}}\right)+\frac{\partial C_{1g}}{\partial d_1}\right];$$

-continued $$\frac{\partial \Psi_2^{(3)}}{\partial d_1} = \frac{-C_{12}C_{13}C_{22}}{D^2}\left[\frac{\partial C_{1g}}{\partial d_1} + \left(1 - \frac{D}{C_{13}C_{22}}\right)\frac{\partial C_{13}}{\partial d_1}\right];$$

$$\frac{\partial \Psi_1^{(3)}}{\partial d_2} = \frac{-C_{11}C_{13}C_{22}}{D^2}\left(1 - \frac{D}{C_{11}C_{22}}\right)\left(\frac{\partial C_{2g}}{\partial d_2} + \frac{\partial C_{24}}{\partial d_2}\right);$$

$$\frac{\partial \Psi_2^{(3)}}{\partial d_2} = \frac{-C_{12}C_{13}C_{11}}{D^2}\left(\frac{\partial C_{24}}{\partial d_2} + \frac{\partial C_{2g}}{\partial d_2}\right); \frac{\partial \Psi_1^{(4)}}{\partial d_1} = \frac{-C_{12}C_{24}C_{22}}{D^2}\left[\frac{\partial C_{13}}{\partial d_1} + \frac{\partial C_{1g}}{\partial d_1}\right];$$

$$\frac{\partial \Psi_2^{(4)}}{\partial d_1} = \frac{-C_{11}C_{24}C_{22}}{D^2}\left(1 - \frac{D}{C_{11}C_{22}}\right)\left(\frac{\partial C_{13}}{\partial d_1} + \frac{\partial C_{1g}}{\partial d_1}\right);$$

$$\frac{\partial \Psi_1^{(4)}}{\partial d_2} = \frac{-C_{12}C_{24}C_{11}}{D^2}\left[\frac{\partial C_{2g}}{\partial d_2} + \left(1 - \frac{D}{C_{24}C_{11}}\right)\frac{\partial C_{24}}{\partial d_2}\right];$$

$$\frac{\partial \Psi_2^{(4)}}{\partial d_2} = \frac{-C_{24}C_{11}^2}{D^2}\left[\frac{\partial C_{24}}{\partial d_2}\left(1 - \frac{D}{C_{24}C_{11}}\right) + \frac{\partial C_{2g}}{\partial d_2}\right];$$

where $$\frac{\partial C_{2g}}{\partial d_2}, \frac{\partial C_{1g}}{\partial d_1}, \frac{\partial C_{24}}{\partial d_2} \text{ and } \frac{\partial C_{13}}{\partial d_1}$$

are unknown capacitances that can be obtained by solving above equations, while the additional unknowns, $\Delta\Phi$ and $$\frac{\partial C_{3g}}{\partial d_1}, \frac{\partial C_{4g}}{\partial d_2}$$

can be found during system calibration.

Under an influence of the forces $F_3$ (t) and $F_4$ (t) the MEMS cantilevers 706 and 708 will oscillate simultaneously on next frequencies $\Omega_3$, $\Omega_4$, 2 $\Omega_3$, 2 $\Omega_4$, $\Omega_3+\Omega_4$ and $\Omega_4-\Omega_3$ if frequencies $\Omega_3$ and $\Omega_4$ of the ac voltages $V_3$ and $V_4$ are not equal. To simplify computations, the frequencies $\Omega_3$ and $\Omega_4$ of the AC voltages $V_3$ and $V_4$ can be selected to enable only one MEMS cantilever to oscillate at its natural mechanical resonance. Mechanical resonance of the MEMS cantilevers 706 and 708 can be produced by the plurality of harmonic electrostatic forces represented by above equations if its frequency is substantially similar to the resonant frequency of a cantilever or any other suitable selected frequency. Harmonic forces $F_{3R}$ and $F_{4R}$ that force the cantilevers 706 and 708, respectively, to oscillate at their mechanical resonance or any other suitable selected frequency can be written as $F_{3R}=F_{30} \sin(\Omega_{res5}t)$ and $F_{4R}=F_{40} \sin(\omega_{res6}t)$, where $\omega_{res5}$ and $\omega_{res6}$ are angular resonant or suitable selected frequencies of the MEMS cantilevers 706 and 708, respectively, and $F_{30}$, $F_{40}$ are force amplitudes.

If A and B are resonant oscillation amplitudes of the MEMS cantilevers 706 and 708, respectively, they can be defined as follows: $A=g_{c5}F_{30}$ and $B=_{c6}F_{40}$, where $g_{c5}$ and $g_{c6}$ represent transfer functions between force amplitudes $F_{30}$ and $F_{40}$ and the oscillation amplitudes A and B of the cantilevers 706 and 708, respectively: In accordance with one aspect of the present invention, the transfer functions $g_{c5}$ and $g_{c6}$ can be obtained empirically by observing alterations in amplitudes of A and B and comparing the amplitudes with known force amplitudes acting on tips (not shown) of the MEMS cantilevers 706 and 708.

Amplitudes of output resonance sensed by a sensing component (not shown) and amplified by one or more amplifiers (not shown) are related to the oscillation amplitudes A and B by equations $V_I=g_1A$ and $V_{II}=g_2B$, where $g_1$ and $g_2$ represent transfer functions between oscillation amplitudes A and B of the MEMS cantilevers 706 and 708, respectively, and output signal amplitudes $V_I$ and $V_{II}$ sensed by sensors and amplified by amplifiers. Such transfer functions can be obtained empirically by observing alterations in amplitudes $V_I$ and $V_{II}$ and comparing such amplitudes with known oscillation amplitudes of tips (not shown) of the MEMS cantilevers 706 and 708. Via substitution, relations between amplitudes $V_I$, $V_{II}$, $F_{30}$, and $F_{40}$ can be seen in the following equations: $V_1=\mu g_1 g_{c5}F_{30}$ and $V_{II}=g_2 g_{c6}F_{40}$. There ten disparate independent combinations of amplitudes and frequencies of AC voltages $V_3$ and $V_4$ that can be applied to tips (not shown) of the cantilevers 706 and 708 that force only a single cantilever to oscillate at the resonance. While the above analysis has been described with particular specificity with respect to allowing only one cantilever to oscillate, it is to be understood that such an embodiment is merely exemplary. Any system that employs multiple cantilevers that mechanically oscillate upon deliverance of a voltage across proximate VLSI circuit interconnects is contemplated by the present invention and intended to fall within the scope of the hereto-appended claims. Moreover, the computing component 220 (FIG. 2) can complete any of the above calculations to output desirable calculations.

Turning now to FIGS. 9–17, an exemplary system 900 that facilitates in-line characterization of VLSI circuit interconnects without requiring contact thereto is illustrated. The figures illustrate a series of AC voltages that can be applied to a pair of cantilevers to effectuate robust characterization of VLSI circuit interconnects, including measurement of coupling capacitance between interconnects, measurement of capacitance between an interconnect and a substrate (acting as ground), and measurement of parasitic capacitance. Moreover, the FIGS. 9–17 illustrate a methodology for obtaining five measurements of $V_I$ and $V_{II}$ as discussed supra.

Figure 9:
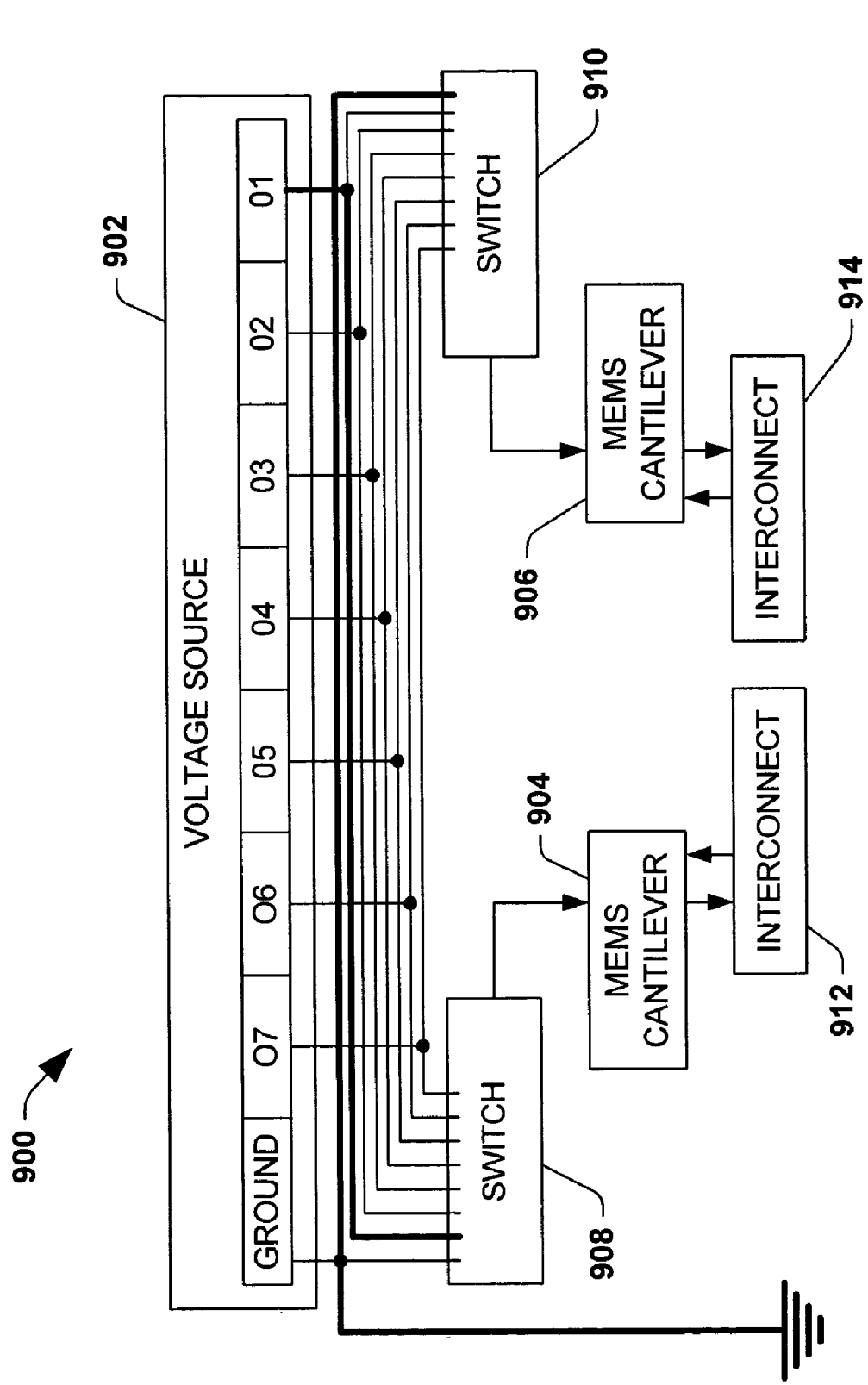
FIGS. 9–18 are illustrations of an exemplary voltage source and disparate voltages that can be applied to MEMS cantilevers in accordance with an aspect of the present invention.

Referring first to FIG. 9, the system 900 comprises a voltage source 902 that delivers sinusoidal voltages to a pair of MEMS cantilevers 904 and 906 via switches 908 and 910, respectively. The sinusoidal voltages are then injected into a pair of VLSI circuit interconnects 912 and 914, which result in generation of electrostatic forces that can cause one or both of the MEMS cantilevers 904 and 906 to oscillate. The resulting oscillations can be monitored to facilitate characterization of the VLSI circuit interconnects 912 and 914. A first measurement of $V_I$ can be obtained when the switch 908 connects an output O1 of the voltage source 902 to a conductive tip (not shown) of the MEMS cantilever 904 (e.g., the MEMS cantilever can be conductive, or only a tip of the MEMS cantilever can be conductive). The output voltage has amplitude of $V_{10}$ and a frequency that is substantially similar to half of the resonance frequency $f_{res5}$ of the cantilever 904. A conductive tip (not shown) of the MEMS cantilever 906 is connected to ground, thereby placing the cantilever 906 out of resonance and the cantilever 904 within resonance. Thus $V_1 = g_1 g_{c5} F_{3,2\Omega_3}$.

Figure 10:
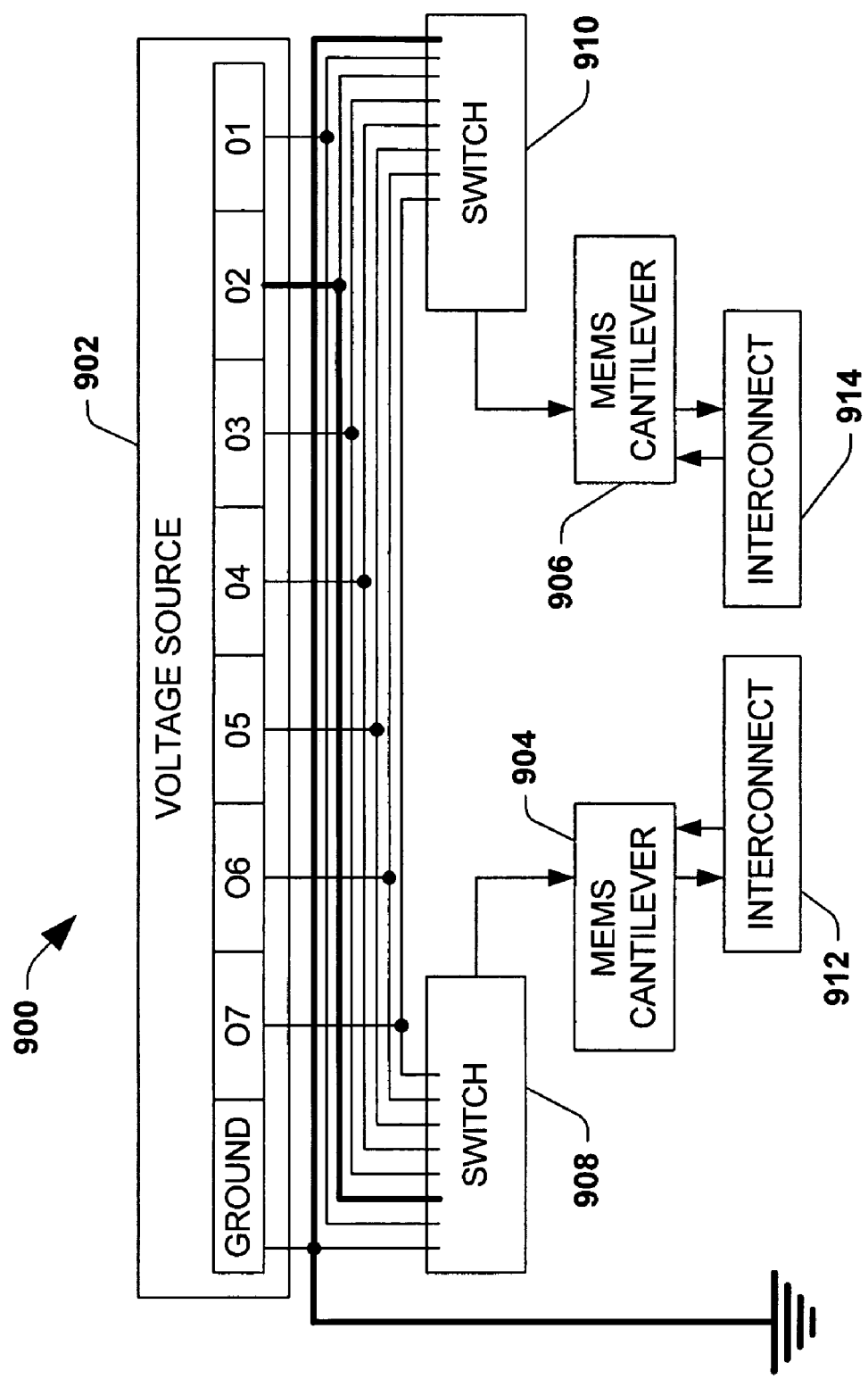

Turning now to FIG. 10, a measurement of $V_{II}$ is obtained. An amplitude of $V_{II}$ can be measured when the switch 908 connects a conductive tip of the MEMS cantilever 904 to output O2 of the voltage source 902 and the switch 910 connects a conductive tip of the MEMS cantilever 906 to ground. The voltage output from output O2 has amplitude of $V_{20}$ and frequency that is substantially equal to half of the resonance frequency $f_{res6}$ of the MEMS cantilever 906. Therefore, during such a measurement the cantilever 904 is out of resonance while the cantilever 906 is at resonance. Thus $V_{II} = g_2 g_{c6} F_{4,2\Omega_3}$.

Figure 11:
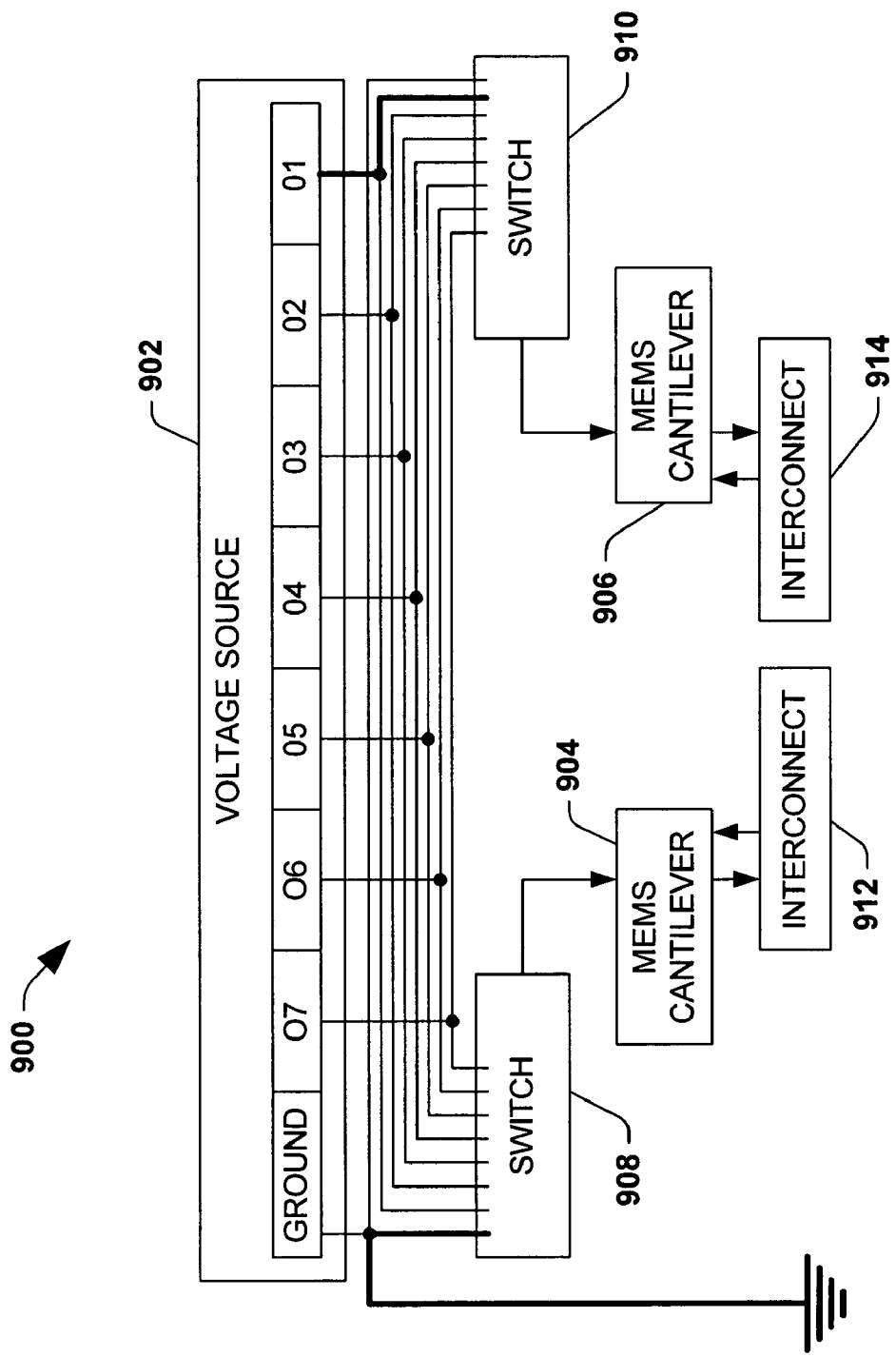

Now referring to FIG. 11, a measurement of $V_I$ can be obtained. An amplitude of $V_I$ is measured when the switch 908 connects a conductive tip of the MEMS cantilever 904 to ground and the switch 910 connects a conductive tip of the MEMS cantilever 906 to output O1. The voltage output from output O1 has amplitude of $V_{10}$ and frequency that is substantially similar to half of the resonance frequency $f_{res5}$ of the cantilever 906. Therefore, during such a measurement the cantilever 906 is out of resonance and the cantilever 904 is at resonance. Thus, $V_1 = g_1 g_{c5} F_{3,2\Omega_4}$.

Figure 12:
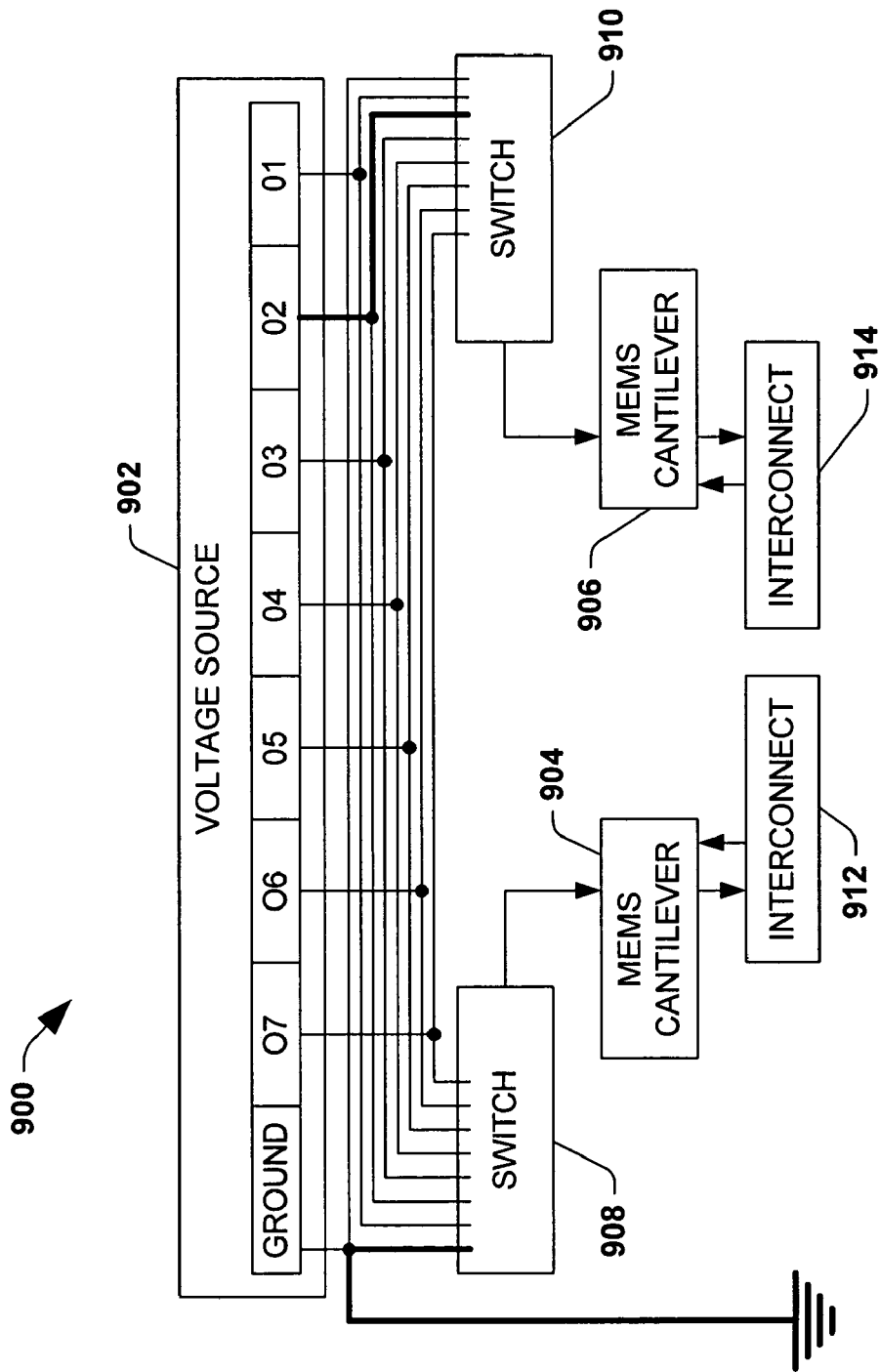

Turning now to FIG. 12, a measurement of $V_{II}$ can be obtained. An amplitude of $V_{II}$ is measured when the switch 908 connects a conductive tip of the MEMS cantilever 904 to ground and the switch 910 connects a conductive tip of the MEMS cantilever 906 to output O2. The voltage output form the output O2 has amplitude of $V_{20}$ and frequency that is substantially similar to half of the resonance frequency $f_{res6}$ of the cantilever 908. Therefore, during such measurement the cantilever 904 is out of resonance and the cantilever 906 is at resonance. Thus, $V_{II} = g_2 g_{c6} F_{4,2\Omega_4}$.

Figure 13:
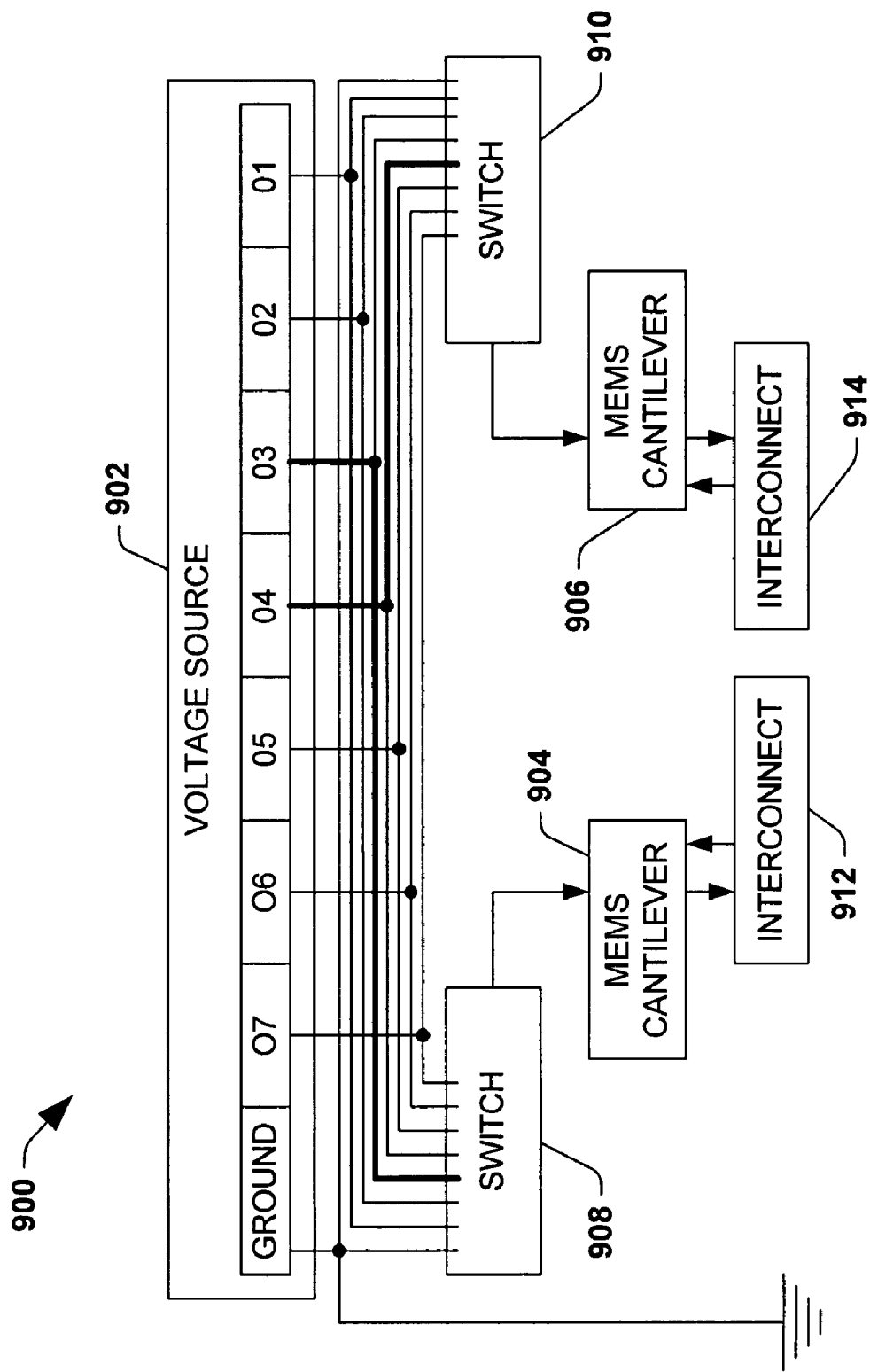

Now regarding FIG. 13, a measurement of $V_I$ can be obtained. An amplitude of $V_I$ is measured when the switch 908 connects a conductive tip of the MEMS cantilever 904 to output O3 and the switch 910 connects a conductive tip of the MEMS cantilever 906 to the output O4 of the voltage source 902. The voltage output from the output O3 has amplitude of $V_{30}$ and a frequency $f_3$, and the output O4 has an amplitude $V_{40}$ and a frequency $f_4$ that is substantially similar to the resonance frequency $f_{res5}$ of the cantilever 904 plus a frequency $f_3$ ($f_4 = f_{res5} + f_3$), where $f_3$ is substantially similar to $bf_{res6}$, and wherein $b \geq 1.3$. Alternatively, the frequency $f_4$ can be substantially similar to $f_{res5}(1+ab)$, and also can be substantially similar to $$\frac{f_{res6}}{a}(1+ab),$$

wherein $$a = \frac{f_{res6}}{f_{res5}}.$$

Therefore, during such measurement the cantilever 904 is at resonance and the cantilever 906 is out of resonance. Thus, $V_1 = \mu g_1 g_{c5} F_{3,\Omega_4 \pm 3}$.

Figure 14:
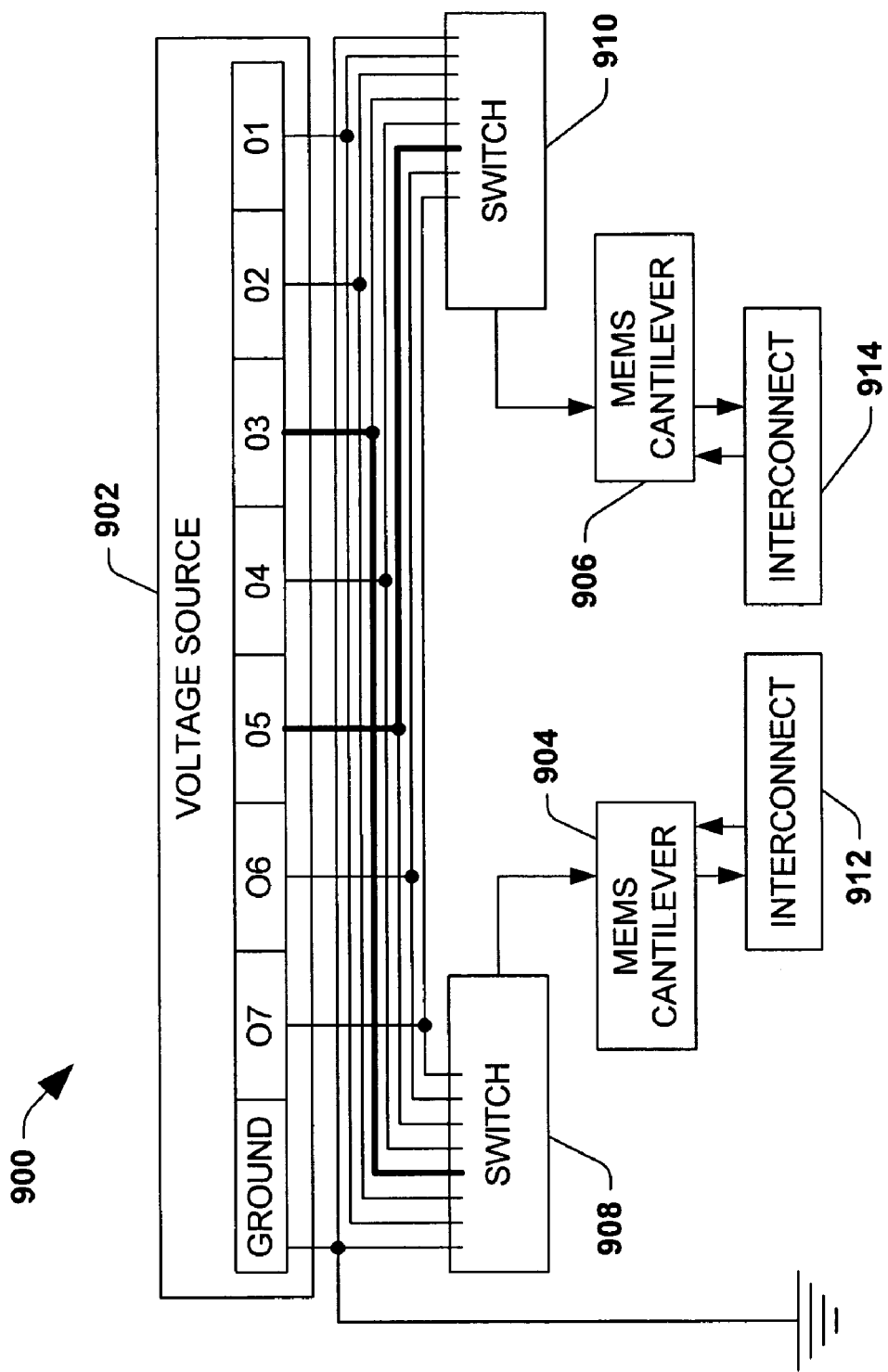

Turning now to FIG. 14, a measurement of $V_{II}$ can be obtained. An amplitude of $V_{II}$ is measured when the switch 908 connects a conductive tip of the MEMS cantilever 904 to the output O3 of the voltage source 902 and the switch 910 connects a conductive tip of the MEMS cantilever 906 to the output O5. The voltage output from the output O3 has amplitude of $V_{30}$ and frequency of $f_3$, and the voltage output from the output O5 has amplitude of $V_{50}$ and frequency $f_5$ that is equal to the resonance frequency $f_{res6}$ of the MEMS cantilever 906 plus the frequency $f_3$ ($f_5 = f_{res6} + f_3$). Furthermore, the frequency $f_5$ is also substantially similar to $af_{res5}(1+b)$, as well as substantially similar to $f_{res6}(1+ab)$. Thus, during such measurement the cantilever 904 is out of resonance and the cantilever 906 is at resonance. Thus, $V_{II} = g_2 g_{c6} F_{4,\Omega_4 \pm \Omega_3}$.

Figure 15:
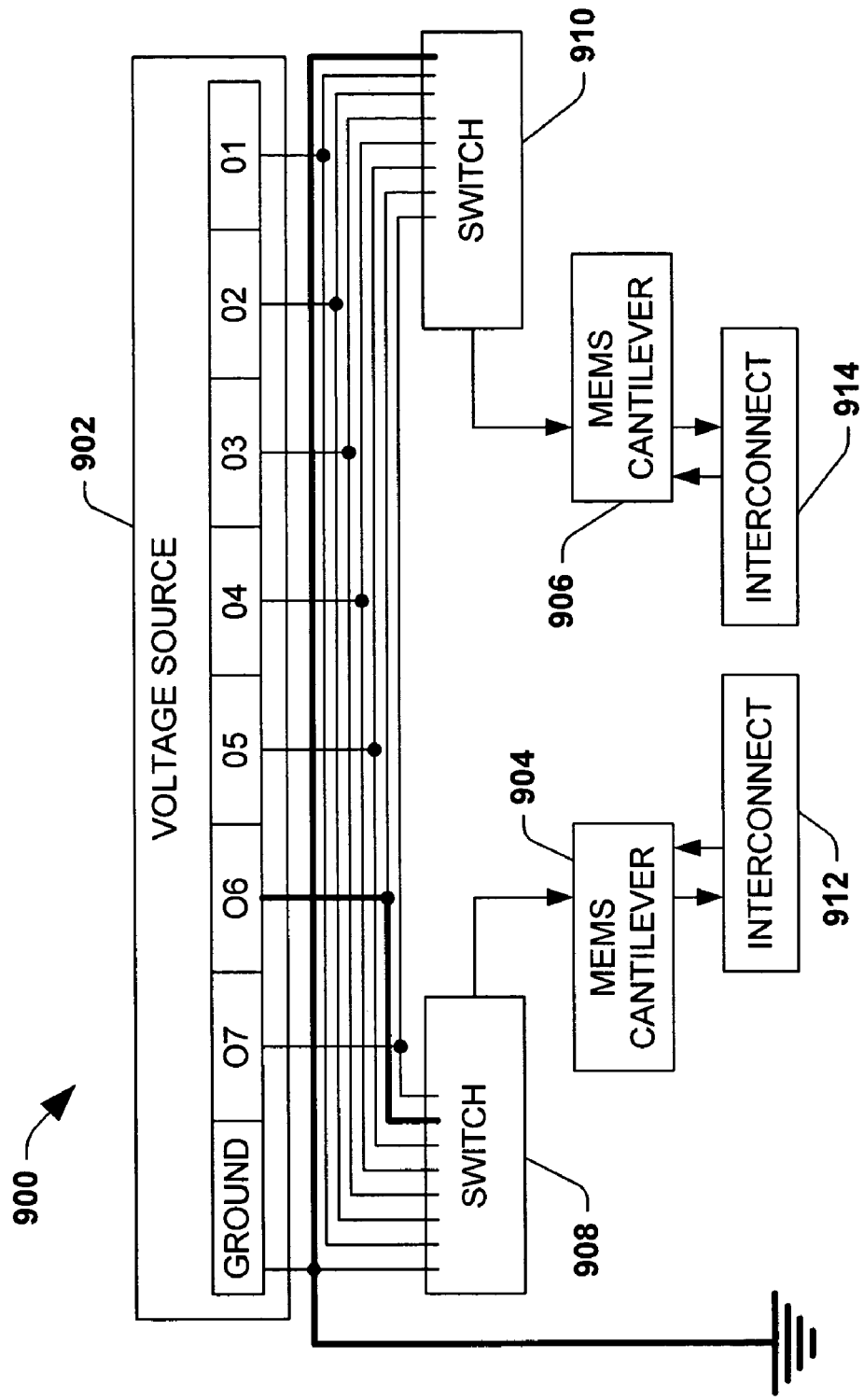

Now regarding FIG. 15, a measurement of $V_1$ can be obtained. An amplitude of $V_1$ is measured when the switch 908 connects a conductive tip of the MEMS cantilever 904 to the output O6 of the voltage source 902 and the switch 910 connects a conductive tip of the MEMS cantilever 906 to ground. The voltage output from the output O6 has amplitude of $V_{60}$ and a frequency substantially similar to the resonance frequency $f_{res5}$ of the cantilever 904. Therefore, during such measurement the cantilever 904 is at resonance and the cantilever 906 is out of resonance. Thus, $V_1 = g_1 g_{c5} F_{3,\Delta\Phi,\Omega_3}$.

Figure 16:
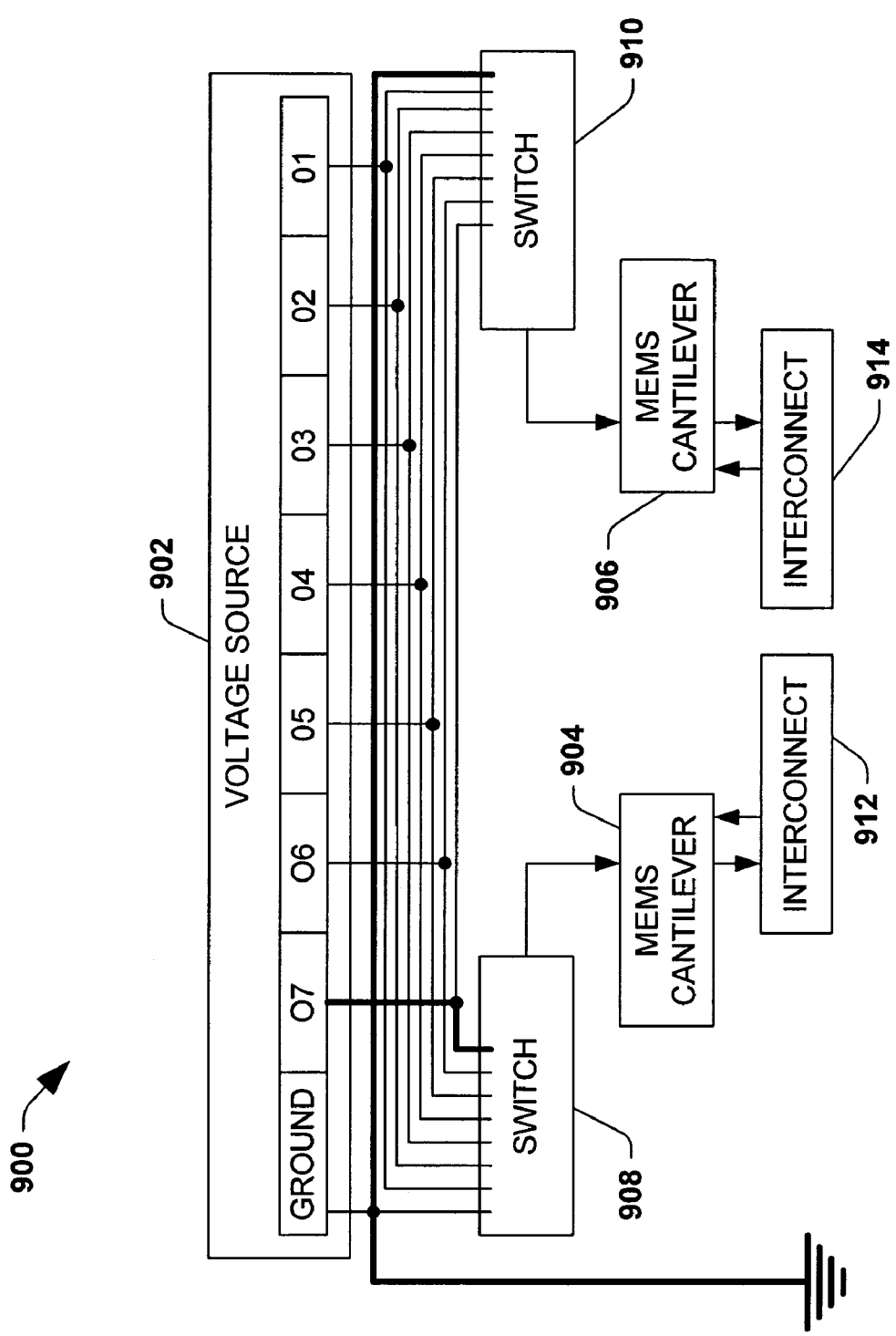

Referring now to FIG. 16, a measurement of $V_{II}$ can be obtained. An amplitude of $V_{II}$ is measured when the switch 908 connects a conductive tip of the MEMS cantilever 904 to the output O7 of the voltage source 902 and the switch 910 connects a conductive tip of the MEMS cantilever 906 to ground. The voltage output from the output O7 has amplitude of $V_{70}$ and a frequency substantially similar to the resonance frequency $f_{res6}$ of the cantilever 906. Therefore, during such measurement the cantilever 904 is out of resonance and the cantilever 906 is at resonance. Thus, $V_{II} = g_2 g_{c6} F_{4,\Delta\Phi,\Omega_3}$.

Figure 17:
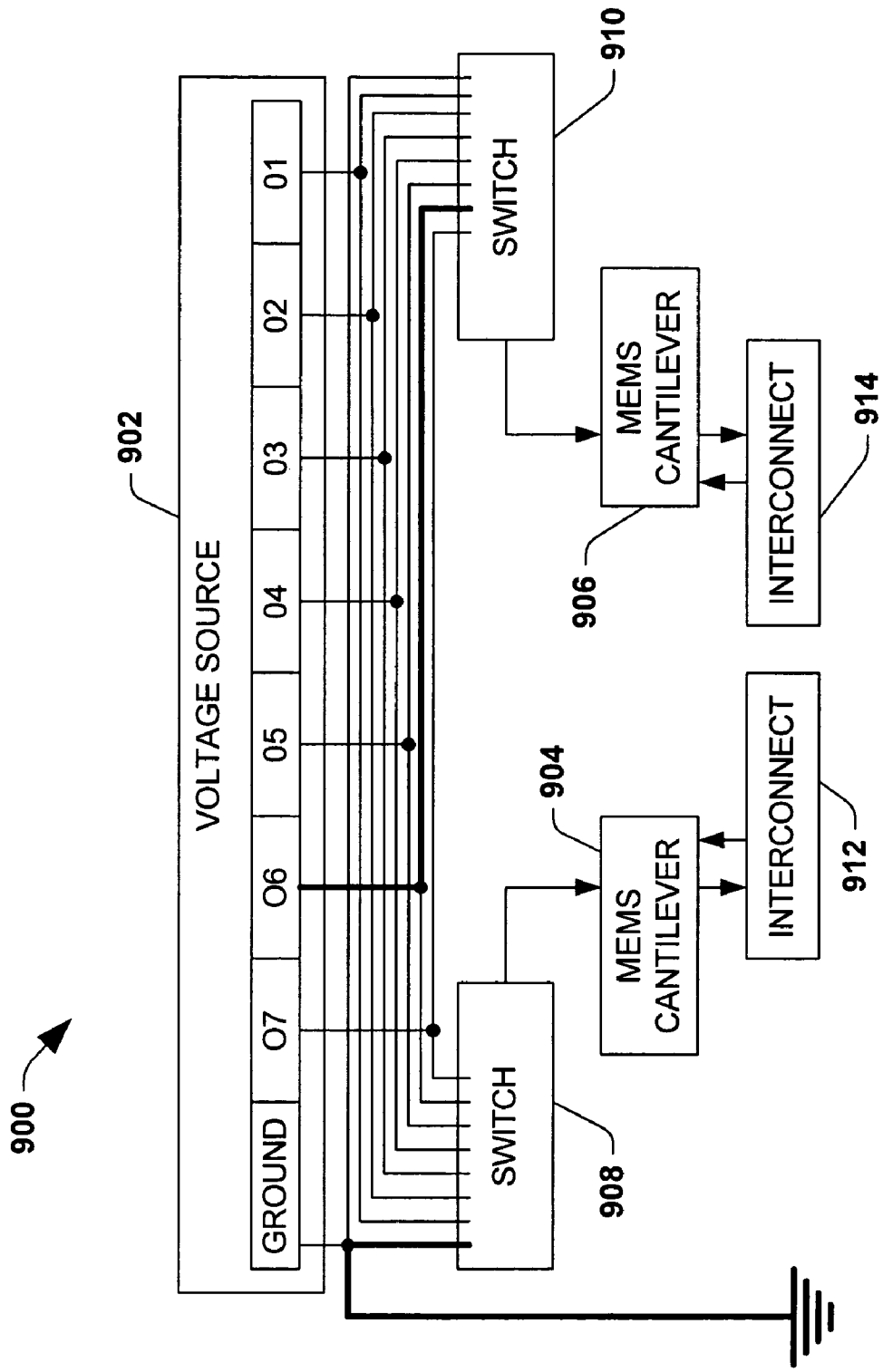

Turning now to FIG. 17, a measurement of $V_I$ can be obtained. An amplitude of $V_I$ is measured when the switch 908 connects a conductive tip of the MEMS cantilever 904 to ground and the switch 910 connects a conductive tip of the MEMS cantilever 906 to the output O6 of the voltage source 902. The voltage output from the output O6 has amplitude of $V_{60}$ and a frequency substantially similar to the resonance frequency $f_{res5}$ of the cantilever 904. Therefore, during such measurement the cantilever 904 is at resonance and the cantilever 906 is out of resonance. Thus, $V_1 = g_1 g_{c5} F_{3,\Delta\Phi,\Omega_4}$.

Figure 18:
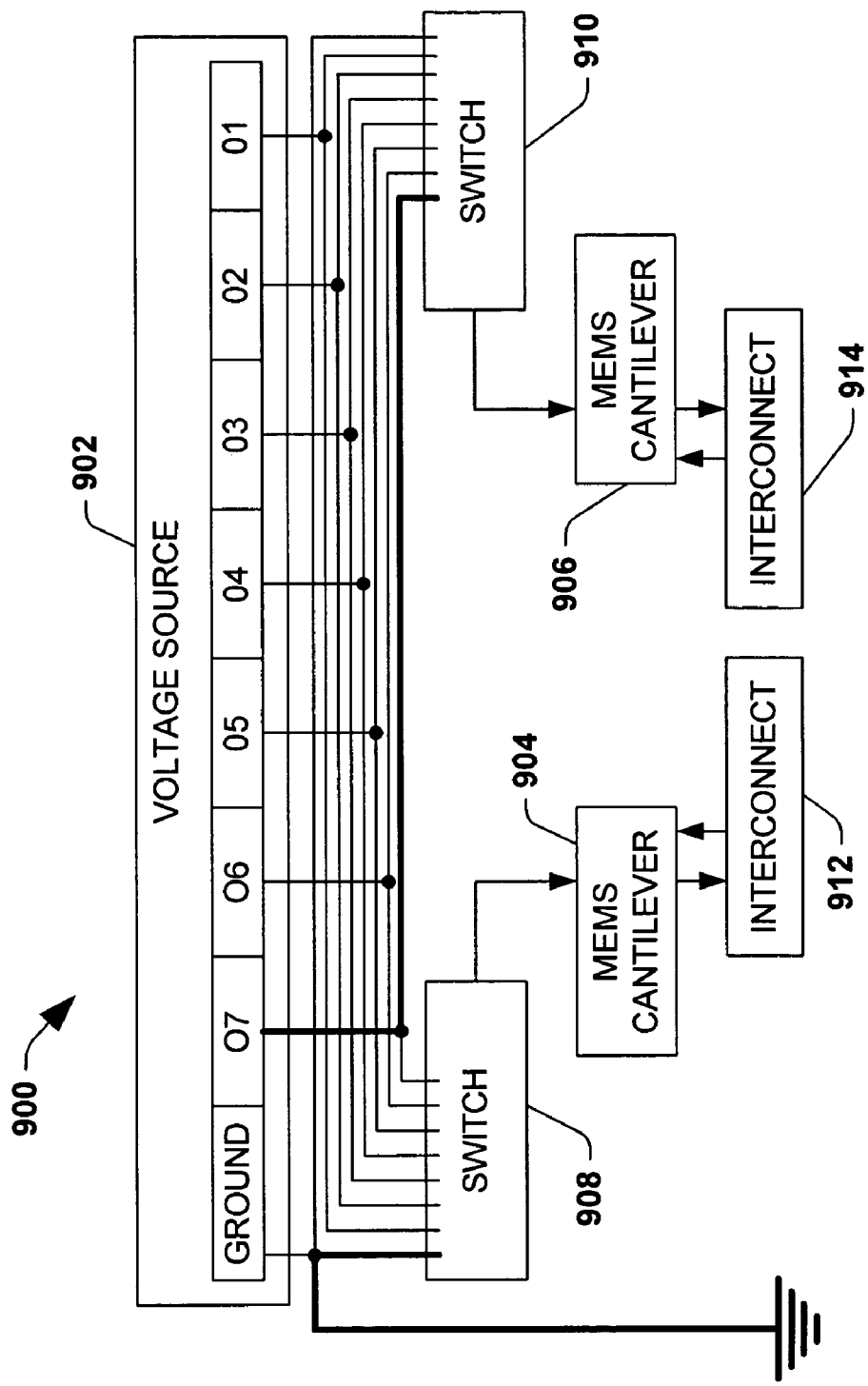

Now referring to FIG. 18, a measurement of $V_{II}$ can be obtained. An amplitude of $V_{II}$ is measured when the switch 908 connects a conductive tip of the MEMS cantilever 904 to ground and the switch 910 connects a conductive tip of the MEMS cantilever to the output O7 of the voltage source 902. The voltage output from the output O7 has amplitude of $V_{70}$ and a frequency substantially similar to the resonance frequency $f_{res6}$ of the cantilever 906. Therefore, during such measurement the cantilever 904 is out of resonance and the cantilever 906 is at resonance. Thus, $V_{II} = g_2 g_{c6} F_{4,\Delta\Phi,\Omega_4}$.

From such ten measurements, the computing component 220 (FIG. 2) can calculate forces $F_{3,2\Omega_3}$, $F_{4,2\Omega_3}$ etc. as discussed with respect to FIG. 7. Such forces can in turn be employed to calculate capacitances $C_{12}$, $C_{1g}$, and $C_{2g}$ as illustrated in FIG. 7.

Returning to FIG. 7, measurement of capacitances $C_{12}$ and $C_{2g}$ can be performed when a conductive tip (not shown) of the MEMS cantilevers 706 contacts one the interconnect 710 the MEMS cantilever 708 does not contact the interconnect 712. In such an instance, only measurements taken with respect to FIGS. 10, 12, 14, 16, and 18 are necessary to calculate the aforementioned capacitances. From such five measurements of $V_I$, electrostatic force components (e.g., $F_{4,2\Omega_3}$, $F_{4,2\Omega_4}$, ... ) can be calculated, which in turn can be employed to calculate $C_{12}$ and $C_{2g}$. For instance, the equations $$F_{4,2\Omega_3} = V_{10}^2 \left[ \Psi_2^{(3)2} \frac{\partial C_{24}}{\partial d_2} + 2\Psi_2^{(3)} C_{24} \left( \frac{\partial \Psi_2^{(3)}}{\partial d_2} \right) \right],$$

$$F_{4,2\Omega_4} = V_{20}^2 \left[ \frac{\partial C_{4g}}{\partial d_2} + \left(1 - 2\Psi_2^{(4)} + \Psi_2^{(4)2}\right) \frac{\partial C_{24}}{\partial d_2} - 2(1 - \Psi_2^{(4)}) C_{24} \left( \frac{\partial \Psi_2^{(4)}}{\partial d_2} \right) \right],$$

$$F_{4,\Omega_4 \pm \Omega_3} = -2V_{30}V_{50} \left[ (1 - \Psi_2^{(4)}) \Psi_2^{(3)} \frac{\partial C_{24}}{\partial d_2} + \left( \frac{\partial \Psi_2^{(3)}}{\partial d_2} - \Psi_2^{(4)} \frac{\partial \Psi_2^{(3)}}{\partial d_2} - \Psi_2^{(3)} \frac{\partial \Psi_2^{(4)}}{\partial d_2} \right) C_{24} \right],$$

$$F_{4,\Delta\Phi,\Omega_3} = -\Delta\Phi \cdot V_{70} \left[ \Psi_2^{(3)} \frac{\partial C_{24}}{\partial d_2} + C_{24} \frac{\partial \Psi_2^{(3)}}{\partial d_2} \right], \text{ and}$$

$$F_{4,\Delta\Phi,\Omega_4} = \Delta\Phi \cdot V_{70} \left[ (1 - \Psi_2^{(4)}) \frac{\partial C_{24}}{\partial d_2} - C_{24} \frac{\partial \Psi_2^{(4)}}{\partial d_2} \right]$$

can be employed to calculate capacitances $C_{12}$ and $C_{2g}$, where $$\Psi_2^{(3)} = \frac{C_{12}}{C_{2g} + C_{24} + C_{12}}, \quad \Psi_2^{(4)} = \frac{C_{24}}{C_{2g} + C_{24} + C_{12}},$$

$$\frac{\partial \Psi_2^{(3)}}{\partial d_2} = \frac{-C_{12}}{(C_{2g} + C_{24} + C_{12})^2} \left[ \frac{\partial C_{24}}{\partial d_2} + \frac{\partial C_{2g}}{\partial d_2} \right], \text{ and}$$

$$\frac{\partial \Psi_2^{(4)}}{\partial d_2} = \frac{-C_{24}}{(C_{2g} + C_{24} + C_{12})^2} \left[ \frac{\partial C_{24}}{\partial d_2} \left( 1 - \frac{C_{2g} + C_{24} + C_{12}}{C_{24}} \right) + \frac{\partial C_{2g}}{\partial d_2} \right].$$

Alternatively, capacitances $C_{12}$ and $C_{1g}$ can be calculated when a conductive tip of the MEMS cantilever 706 does not contact the interconnect 710 while a conductive tip of the MEMS cantilever 708 contacts the interconnect 712. In such an instance, only measurements taken with respect to FIGS. 9, 11, 13, 15, and 17 are necessary to calculate the aforementioned capacitances. From such five measurements of $V_I$, electrostatic force components (e.g., $F_{3,2\Omega_3}$, $F_{3,2\Omega_4}$, ... ) can be calculated, which in turn can be employed to calculate $C_{12}$ and $C_{1g}$. For example, the equations $$F_{3,2\Omega_3} = V_{10}^2 \left[ \frac{\partial C_{3g}}{\partial d_1} + \left(1 - 2\Psi_1^{(3)} + \Psi_1^{(3)2}\right) \frac{\partial C_{13}}{\partial d_1} - 2(1 - \Psi_2^{(3)}) C_{13} \left( \frac{\partial \Psi_1^{(3)}}{\partial d_1} \right) \right],$$

$$F_{3,2\Omega_4} = V_{20}^2 \left[ (\Psi_1^{(4)})^2 \frac{\partial C_{13}}{\partial d_1} + 2(\Psi_1^{(4)}) C_{13} \frac{\partial \Psi_1^{(4)}}{\partial d_1} \right],$$

$$F_{3,\Omega_4 \pm \Omega_3} = -2V_{30}V_{40} \left[ (1 - \Psi_1^{(3)}) \Psi_1^{(4)} \frac{\partial C_{13}}{\partial d_1} + \left( \frac{\partial \Psi_1^{(4)}}{\partial d_1} - \Psi_1^{(3)} \frac{\partial \Psi_1^{(4)}}{\partial d_1} - \Psi_1^{(4)} \frac{\partial \Psi_1^{(3)}}{\partial d_1} \right) C_{13} \right],$$

$$F_{3,\Delta\Phi,\Omega_3} = \Delta\Phi \cdot V_{60} \left[ (1 - \Psi_1^{(3)}) \frac{\partial C_{13}}{\partial d_1} - C_{13} \frac{\partial \Psi_1^{(3)}}{\partial d_1} \right], \text{ and}$$

$$F_{3,\Delta\Phi,\Omega_4} = -\Delta\Phi \cdot V_{60} \left[ \Psi_1^{(4)} \frac{\partial C_{13}}{\partial d_1} + C_{13} \frac{\partial \Psi_1^{(4)}}{\partial d_1} \right]$$

can be employed to calculate $C_{12}$ and $C_{1g}$ where $$\Psi_1^{(3)} = \frac{C_{13}}{C_{1g} + C_{12} + C_{13}}, \quad \Psi_1^{(4)} = \frac{C_{12}}{C_{1g} + C_{12} + C_{13}},$$

$$\frac{\partial \Psi_1^{(4)}}{\partial d_1} = \frac{-C_{12}}{(C_{1g} + C_{13} + C_{12})^2} \left[ \frac{\partial C_{13}}{\partial d_1} + \frac{\partial C_{1g}}{\partial d_1} \right], \text{ and}$$

$$\frac{\partial \Psi_1^{(3)}}{\partial d_1} = \frac{-C_{13}}{(C_{1g} + C_{13} + C_{12})^2} \left[ \frac{\partial C_{13}}{\partial d_1} \left( 1 - \frac{C_{1g} + C_{13} + C_{12}}{C_{13}} \right) + \frac{\partial C_{1g}}{\partial d_1} \right].$$

Figure 19:
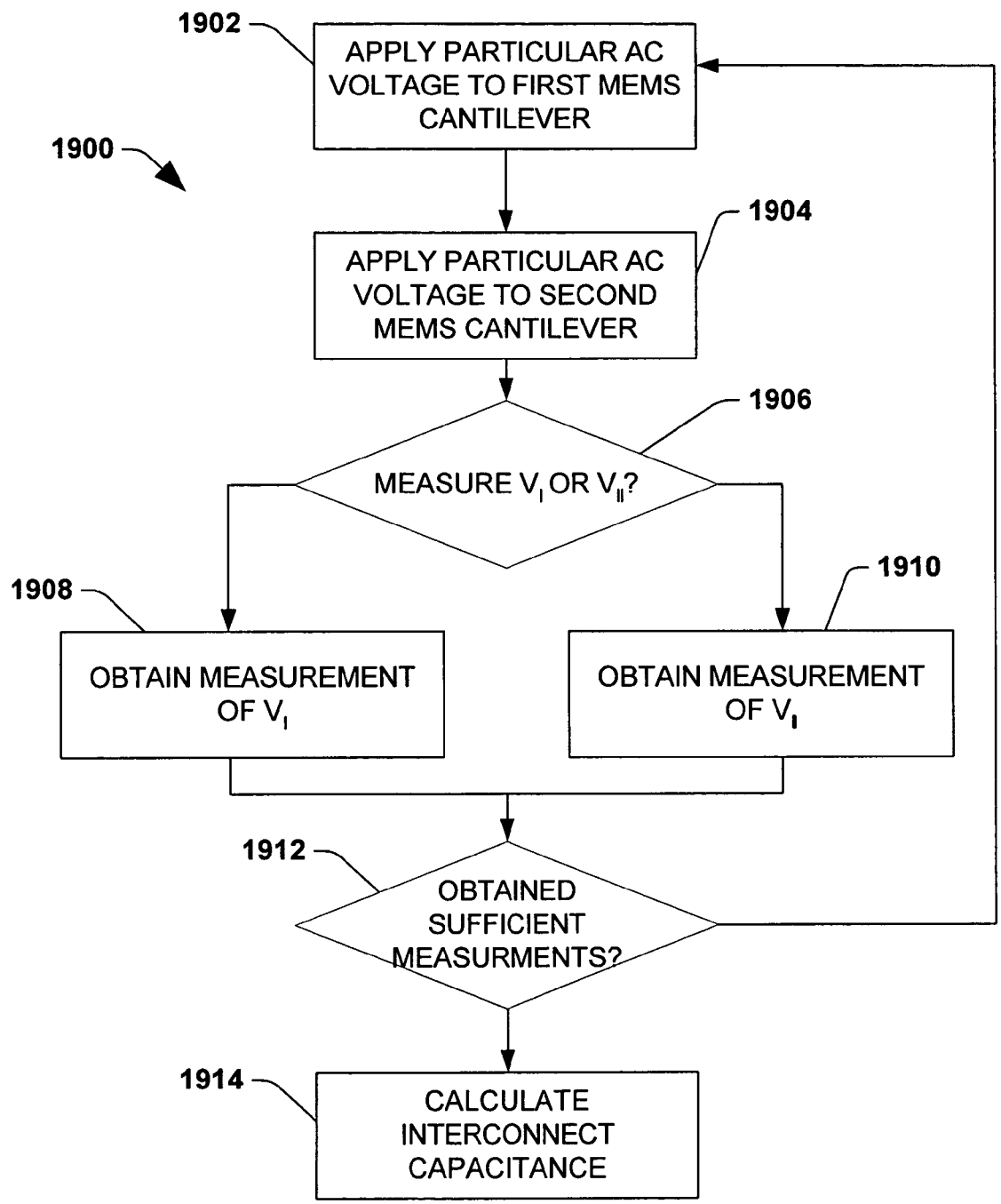
FIG. 19 is a representative flow diagram that illustrates a methodology that facilitates characterization of VLSI circuit interconnects in accordance with an aspect of the present invention.

Turning now to FIG. 19, a methodology 1900 for applying a plurality of disparate voltages to conductive tips of MEMS cantilevers that are positioned proximate to VLSI circuit interconnects. The methodology facilitates measuring a plurality of capacitances related to VLSI circuit interconnects, and thus facilitates characterization of such VLSI circuit interconnects. In accordance with one aspect of the present invention, one of the conductive tips can contact a VLSI circuit interconnect while a conductive tip of a second MEMS cantilever does not contact a VLSI circuit interconnect. Alternatively, the conductive tips of both MEMS cantilevers do not contact the VLSI circuit interconnects.

At 1902, a particular voltage is applied to a first MEMS cantilever. For example, a voltage with frequency substantially equivalent to a resonant frequency of the cantilever can be applied to such cantilever. Furthermore, the MEMS cantilever can be attached to ground (thus applying a zero voltage to the MEMS cantilever). Moreover, voltages with any suitable amplitude and any suitable frequency can be applied to the first MEMS cantilever. At 1904, a particular voltage is applied to a second MEMS cantilever. Such application of voltages generate mechanical oscillations on the MEMS cantilevers. In accordance with one aspect of the present invention, voltages can be selectively applied to the first and second MEMS cantilevers to cause only a single cantilever to mechanically oscillate at resonant frequencies. At 1906, a determination is made regarding whether a measurement of $V_I$ or $V_{II}$ is desirable. A computing component and/or control component can facilitate a determination of which measurement is desirably taken (and which voltages to deliver to the MEMS cantilevers). If $V_I$ is desirably measured, at 1908 such measurement is completed. If $V_{II}$ is desirably measured, at 1910 such measurement is completed. At 1912, a determination is made regarding whether a sufficient number of measurements have been obtained. For example, in a non-contact modality, ten measurements (five of $V_I$ and five of $V_{II}$) may be required to facilitate robust characterization of a pair of VLSI circuit interconnects. Alternatively, in a contact modality, five measurements of either $V_I$ and $V_{II}$ may be necessary to robustly characterize capacitance of VLSI circuit interconnects. If more measurements are desirable, the methodology repeats. If sufficient measurements have been taken, then at 1914 capacitance measurements can be calculated. Equations discussed supra can be employed in connection with calculating capacitance.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates non-invasive in-line characterization of parameters of VLSI circuit interconnects, comprising:
a plurality of micro-electro-mechanical system (MEMS) cantilevers that apply voltage(s) to VLSI circuit interconnect(s) without physical contact thereto;
a measuring component that measures deflection characteristics of the cantilevers, the deflection(s) correspond to electrical forces generated from the applied voltage(s) as passed through VLSI circuit interconnect(s); and
a component that computes characteristics of the VLSI interconnect based at least in part upon the measured deflection characteristics.

2. The system of claim 1, further comprising a control component that effectuates control of a VLSI circuit fabrication process step based at least in part upon the computed characteristics.

3. The system of claim 2, the computed characteristics are employed as feedback information to the control component.

4. The system of claim 2, wherein the computed characteristics are employed as feed-forward information to the control component.

5. The system of claim 1, the MEMS cantilevers comprise conductive tips to effectuate injection of voltages into the VLSI circuit interconnects.

6. The system of claim 5, the MEMS cantilevers act as a conductive path to the conductive tips.

7. The system of claim 5, a conductive path is provided on the MEMS cantilevers to the conductive tips to facilitate injection of currents into the VLSI circuit interconnects.

8. The system of claim 1, further comprising test structures for capacitance and/or resistance measurement.

9. The system of claim 1, further comprising a voltage source that delivers voltages to the MEMS cantilevers, the voltage source delivering disparate voltages to disparate MEMS cantilevers.

10. The system of claim 1, the measuring component comprising a photo-detector that detects a laser beam deflecting off at least one MEMS cantilever.

11. The system of claim 1, the measuring component comprises an optical interferometer.

12. The system of claim 1, further comprising a positioning component that facilitates proper positioning of the MEMS cantilevers with respect to the VLSI circuit interconnects.

13. The system of claim 12, the position components being scanners.

14. The system of claim 1, further comprising a pre-amplifier.

15. The system of claim 1, further comprising an amplifier.

16. The system of claim 1, further comprising a tuning fork, at least one MEMS cantilever is attached to the tuning fork.

17. The system of claim 16, the tuning fork is a quartz tuning fork that can be at least one of self-sensing and self-actuating.

18. The system of claim 16, an electrostatic shield is provided to shield a conductive path across the tuning fork to a conductive tip of the MEMS cantilever.

19. The system of claim 16, a first leg of the MEMS cantilever is attached to a first prong of the tuning fork, and a second leg of the MEMS cantilever is attached to a second prong of the tuning fork.

20. The system of claim 1, at least one MEMS cantilever is a piezo-resistive cantilever.

21. The system of claim 1, employed to measure coupling capacitance between VLSI circuit interconnects.

22. The system of claim 1, employed to measure capacitance between at least one VLSI circuit interconnect and a ground plane.

23. The system of claim 1, the MEMS cantilevers and the VLSI circuit interconnects are within a vacuum chamber.

24. The system of claim 1, utilized to characterize at least one of resistance and capacitance of a transistor.

25. The system of claim 1, a distance between VLSI circuit interconnects is less than 0.2 μm.

26. The system of claim 1, a length of VLSI circuit interconnects is less than 10 μm.

27. The system of claim 1, at least a portion of a first VLSI circuit interconnect to be tested is on a disparate layer compared to a second VLSI circuit interconnect to be tested.

28. The system of claim 1, the VLSI circuit interconnects are covered by a layer of dielectric.

29. A system that facilitates characterization of VLSI circuit interconnects, comprising:
   a voltage source that outputs a plurality of disparate voltages;
   two or more micro-electro-mechanical system (MEMS) cantilevers that receive the voltages output by the voltage source and apply the voltage(s) to VLSI circuit interconnect(s), wherein a first MEMS cantilever contacts a first VLSI interconnect and a second MEMS cantilever does not physically contact a VLSI interconnect;
   a measuring component that measures deflection characteristics of the cantilevers, the deflection(s) correspond to electrical forces generated from the applied voltage(s) as passed through VLSI circuit interconnect(s); and
   a component that computes characteristics of the VLSI interconnect based at least in part upon the measured deflection characteristics.

30. The system of claim 29, wherein the computing component calculates a coupling capacitance between VLSI circuit interconnects based at least in part upon the measured deflection characteristics.

31. The system of claim 29, the computing component calculates a capacitance of a VLSI circuit interconnect that is not contacted by the first MEMS cantilever with respect to ground.

32. A method that facilitates measurement of various parameters of VLSI circuit interconnects, comprising:
   positioning at least two MEMS cantilevers with conductive tips in proximity to at least two adjacent VLSI circuit interconnects;
   providing voltage(s) to the conductive tips;
   injecting the current (s) into the VLSI circuit interconnects via the conductive tips;
   measuring oscillations resultant in the MEMS cantilevers; and
   computing capacitance related to the VLSI circuit interconnects based at least in part upon the measured oscillations.

33. The method of claim 32, further comprising computing coupling capacitance between the two adjacent VLSI circuit interconnects based at least in part upon the measured oscillations.

34. The method of claim 32, further comprising computing capacitance of at least one MEMS cantilever with respect to a ground plane in a substrate.

35. The method of claim 32, further comprising:
   providing a first voltage to a first MEMS cantilever with a frequency substantially similar to one half of at least one of a natural resonant frequency and a user-selected frequency of the first MEMS cantilever; and
   grounding a second MEMS cantilever.

36. The method of claim 32, further comprising:
   providing a first voltage to a first MEMS cantilever with a frequency substantially similar to one half of at least one of a natural resonant frequency and a user-selected frequency of a second MEMS cantilever; and
   grounding the second MEMS cantilever.

37. The method of claim 32, further comprising:
   providing a first voltage to a first MEMS cantilever with a frequency substantially similar to $bf_{res6}$, where b is a constant such that $b \geq 1.3$ and resonance frequency ($f_{res6}$) is substantially similar to one half of at least one of a resonant frequency and a user-selected frequency of a second MEMS cantilever; and
   providing a second voltage to the second MEMS cantilever with a frequency substantially similar to $f_{res6}(1+ab)$, where a resonance frequency($f_{res5}$) is substantially similar to half a resonant frequency of the first MEMS cantilever and a is substantially similar to $f_{res5}/f_{res6}$.

38. The method of claim 32, further comprising:
   providing a first voltage to a first MEMS cantilever with a frequency substantially similar to $bf_{res6}$, where b is a constant such that $b \geq 1.3$ and resonance frequency ($f_{res6}$) is substantially similar to one half of at least one of a resonant frequency and a user-selected frequency of a second MEMS cantilever; and
   providing a second voltage to the second MEMS cantilever with a frequency substantially similar to $f_{res6}(1+ab)$, wherein where a is substantially similar to $f_{res5}/f_{res6}$, and $f_{res5}$ is substantially similar to one half of at least one of a resonant frequency and a user-selected frequency of the first MEMS cantilever.

39. The method of claim 32, further comprising:
   providing a first voltage to a first MEMS cantilever with a frequency substantially similar to at least one of a resonant frequency and a user-selected frequency of the first MEMS cantilever; and
   grounding a second MEMS cantilever.

40. The method of claim 32, further comprising:
   providing a first voltage to a first MEMS cantilever with a frequency substantially similar to at least one of a resonant frequency and a user-selected frequency of a second MEMS cantilever; and
   grounding the second MEMS cantilever.

41. The method of claim 32, further comprising controlling a VLSI circuit fabrication process based at least in part upon measured oscillations.

42. The method of claim 32 employed to characterize a transistor.

43. A system for characterizing of VLSI interconnect circuits, comprising:
   means for positioning two or more MEMS cantilevers proximate to a pair of VLSI circuit interconnects without contact thereto;
   means for injecting currents into the VLSI circuit interconnects via the MEMS cantilevers;
   means for measuring oscillations on the MEMS cantilevers resulting from electrostatic forces generated upon injecting the currents; and
   means for computing capacitance related to the VLSI circuit interconnects based at least in part upon the measured oscillations.

44. The system of claim 43, further comprising means for selectively injecting disparate currents into the VLSI circuit interconnects.

45. The system of claim 44, further comprising means for calculating capacitance based at least in part upon measured oscillations resulting from application of a plurality of disparate voltages.

* * * * *